(12) United States Patent
Yokotani et al.

(10) Patent No.: US 10,337,704 B2
(45) Date of Patent: Jul. 2, 2019

(54) ILLUMINATION LIGHT SOURCE HAVING FASTENER FASTENING A PEDESTAL AND COVER TOGETHER WITH A MOUNTING SUBSTRATE INTERPOSED THEREBETWEEN AND LIGHT EMITTING ELEMENTS SURROUND THE COVER, THE ENTIRETY OF WHICH IS SPACED IN A HORIZONTAL DIRECTION FROM THE LIGHT EMITTING ELEMENTS

(71) Applicant: PANASONIC INTELLECTUAL PROPERTY MANAGEMENT CO., LTD., Osaka (JP)

(72) Inventors: Ryouji Yokotani, Osaka (JP); Yasuharu Ueno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 650 days.

(21) Appl. No.: 14/650,625

(22) PCT Filed: Oct. 16, 2013

(86) PCT No.: PCT/JP2013/006143
§ 371 (c)(1),
(2) Date: Jun. 9, 2015

(87) PCT Pub. No.: WO2014/091657
PCT Pub. Date: Jun. 19, 2014

(65) Prior Publication Data
US 2015/0369461 A1 Dec. 24, 2015

(30) Foreign Application Priority Data

Dec. 13, 2012 (JP) .................... 2012-272080

(51) Int. Cl.
*F21V 19/00* (2006.01)
*F21S 8/02* (2006.01)
(Continued)

(52) U.S. Cl.
CPC .......... *F21V 19/0055* (2013.01); *F21K 9/232* (2016.08); *F21S 8/026* (2013.01);
(Continued)

(58) Field of Classification Search
CPC ....... F21K 9/232; F21V 19/0055; F21S 8/026
See application file for complete search history.

(56) References Cited

U.S. PATENT DOCUMENTS 7,758,223 B2 7/2010 Osawa et al.
8,028,089 B2 9/2011 Christianson et al.
(Continued)

FOREIGN PATENT DOCUMENTS

JP 2005-285446 10/2005
JP 2006-313717 11/2006
(Continued)

OTHER PUBLICATIONS

U.S. Appl. No. 14/605,615 to Ueno et al., filed Jun. 9, 2015.
Search report from PCT/JP2013/006143, dated Dec. 3, 2013.

*Primary Examiner* — Gerald J Sufleta, II
(74) *Attorney, Agent, or Firm* — Greenblum & Bernstein, P.L.C.

(57) ABSTRACT

An illumination light source includes a pedestal, a mounting substrate disposed on the pedestal, a plurality of LEDs mounted on the main surface of the mounting substrate, a cover which covers a partial region of the main surface of the mounting substrate, and a fastener which fastens the pedestal and the cover together while the mounting substrate is interposed between the pedestal and the cover. The plurality of LEDs are mounted so as to surround the cover.

20 Claims, 29 Drawing Sheets

(51) Int. Cl.
*F21V 7/00* (2006.01)
*F21V 23/00* (2015.01)
*F21V 31/00* (2006.01)
*F21K 9/232* (2016.01)
*F21V 3/00* (2015.01)
*F21V 8/00* (2006.01)
*F21Y 105/10* (2016.01)
*F21Y 115/10* (2016.01)

(52) U.S. Cl.
CPC ......... *F21V 7/0016* (2013.01); *F21V 23/002* (2013.01); *F21V 31/005* (2013.01); *F21V 3/00* (2013.01); *F21Y 2105/10* (2016.08); *F21Y 2115/10* (2016.08); *G02B 6/0043* (2013.01); *G02B 6/0061* (2013.01); *H01L 2224/45144* (2013.01); *H01L 2224/48091* (2013.01); *H01L 2224/48137* (2013.01)

(56) References Cited

U.S. PATENT DOCUMENTS

| | | |
|---|---|---|
| 8,398,272 B2 | 3/2013 | Osawa |
| 8,540,408 B2 | 9/2013 | Takahashi et al. |
| 8,858,041 B2 | 10/2014 | Osawa et al. |
| 8,979,315 B2 | 3/2015 | Osawa et al. |
| 8,992,041 B2 | 3/2015 | Osawa |
| 9,062,851 B2 | 6/2015 | Matsubayashi et al. |
| 2006/0227558 A1 | 10/2006 | Osawa et al. |
| 2010/0061092 A1* | 3/2010 | Yang ...................... F21V 15/01 362/234 |
| 2010/0237761 A1 | 9/2010 | Osawa et al. |
| 2010/0237779 A1 | 9/2010 | Osawa et al. |
| 2010/0244650 A1 | 9/2010 | Osawa et al. |
| 2010/0244694 A1 | 9/2010 | Osawa et al. |
| 2010/0253200 A1 | 10/2010 | Osawa et al. |
| 2011/0156569 A1 | 6/2011 | Osawa |
| 2011/0309386 A1 | 12/2011 | Osawa et al. |
| 2011/0310606 A1 | 12/2011 | Osawa et al. |
| 2012/0155080 A1* | 6/2012 | Schupple ............ F21V 19/0055 362/235 |
| 2012/0268943 A1* | 10/2012 | Walczak ................... F21V 5/04 362/294 |
| 2012/0287632 A1* | 11/2012 | Takahashi ............. F21V 23/006 362/235 |
| 2012/0294005 A1 | 11/2012 | Osawa et al. |
| 2012/0294006 A1 | 11/2012 | Osawa et al. |
| 2012/0300458 A1 | 11/2012 | Osawa et al. |
| 2012/0300477 A1 | 11/2012 | Osawa et al. |
| 2013/0049031 A1* | 2/2013 | Matsuda ............... H01L 33/486 257/88 |
| 2013/0148364 A1 | 6/2013 | Osawa |
| 2014/0078744 A1 | 3/2014 | Osawa et al. |
| 2014/0078750 A1 | 3/2014 | Osawa et al. |
| 2014/0078751 A1 | 3/2014 | Osawa et al. |
| 2014/0104837 A1 | 4/2014 | Osawa et al. |

FOREIGN PATENT DOCUMENTS

| | | | |
|---|---|---|---|
| JP | 2009-043447 | 2/2009 | |
| JP | WO 2012090356 A1 * | 7/2012 | ........... H01L 33/486 |
| JP | WO 2012101687 A1 * | 8/2012 | ........... F21V 23/006 |
| JP | 2012-169278 | 9/2012 | |
| JP | 2012-227290 | 11/2012 | |

* cited by examiner (a)

(b)

(a)

(b)

(a)

(b)

ILLUMINATION LIGHT SOURCE HAVING FASTENER FASTENING A PEDESTAL AND COVER TOGETHER WITH A MOUNTING SUBSTRATE INTERPOSED THEREBETWEEN AND LIGHT EMITTING ELEMENTS SURROUND THE COVER, THE ENTIRETY OF WHICH IS SPACED IN A HORIZONTAL DIRECTION FROM THE LIGHT EMITTING ELEMENTS

TECHNICAL FIELD

The present invention relates to illumination light sources and illumination devices, and in particular relates to an illumination light source which uses light-emitting diodes (LEDs) and an illumination device including the illumination light source.

BACKGROUND ART

Due to their high efficiency and long life span, LEDs are used as light sources in a variety of products. In particular, research and development of lamps which use LEDs (i.e., LED lamps), as alternate illumination light sources for conventional fluorescent lamps and conventional bulb-shaped incandescent lamps, is advancing.

Examples of LED lamps include bulb-shaped LED lamps (LED bulbs) as an alternate for bulb-shaped fluorescent and incandescent lamps, and straight tube LED lamps as an alternate for straight tube fluorescent lamps. For example, Patent Literature (PTL) 1 discloses a conventional bulb-shaped LED lamp. Additionally, PTL 2 discloses a conventional straight tube LED lamp.

LED lamps include an LED module as the light source. The LED module includes, for example, a mounting substrate and a plurality of LEDs mounted on the mounting substrate.

CITATION LIST

Patent Literature

[PTL 1] Japanese Unexamined Patent Application Publication No. 2006-313717
[PTL 2] Japanese Unexamined Patent Application Publication No. 2009-043447

SUMMARY OF INVENTION

Technical Problem

The LED module is fixed upon, for example, a pedestal (heat sink) disposed inside the LED lamp. A number of methods can be used to fix the LED module and the pedestal together.

For example, one method includes forming a plurality of through-holes (for example, three) in the mounting substrate on which the LEDs are mounted and forming screw holes in the pedestal, and then directly screwing the mounting substrate and the pedestal together via the through-holes and the screw holes.

However, directly screwing the mounting substrate down has the following problems. For example, when the mounting substrate is a resin substrate such as a glass epoxy substrate, or a metal substrate such as a metal-based substrate, there is a problem that the contactability with the pedestal will decrease due to the outer peripheral edge of the mounting substrate warping or the inner portion of the mounting substrate bulging upward, thereby decreasing heat dissipating properties. Moreover, when the mounting substrate is a ceramic substrate, since ceramic is hard and brittle, there is a problem of the ceramic substrate cracking or splitting from the force of the screw being tightened down.

Methods of fixing the LED module and the pedestal together include screwing a holding member (for example, a metal leaf spring) and the pedestal together next to the mounting substrate while the peripheral edge portion of the mounting substrate is held down by the holding member, rather than directly screwing down the mounting substrate. In this case, the holding member is disposed so as to extend across the peripheral edge portion of the mounting substrate and the pedestal.

However, since the holding member is disposed in a more exterior position than the light-emitting part (LEDs), light emitted from the sides of the light-emitting part outward toward the edges of the mounting substrate is blocked by the holding member. This leads to a degradation in light distribution characteristics due to, for example, a reduction in light emission efficiency and an uneven luminance distribution resulting from light being scattered after being blocked by the holding member. Moreover, since the holding member only holds down the peripheral edge portion of the mounting substrate, when the mounting substrate is a resin or metal substrate, the heat from the LEDs causes the mounting substrate to expand and the central portion of the mounting substrate to warp and bulge upward. This results in a problem where the contactability between the mounting substrate and the pedestal decreases thereby reducing heat dissipating properties. Furthermore, when a conventional holding member is used, the attachment portion (screwed down portion) is outside the mounting substrate, so there is a problem that the size of the LED lamp increases.

The present invention was conceived to solve the above problems and has an object to provide an illumination light source and an illumination device with which warping, cracking, and splitting of the mounting substrate can be inhibited while not degrading light distribution characteristics.

Solution to Problem

In order to achieve the above-described object, the illumination light source according to one aspect of the present invention includes: a pedestal; a mounting substrate disposed on the pedestal; a plurality of light-emitting elements mounted on a main surface of the mounting substrate; a cover which covers a partial region of the main surface of the mounting substrate; and a fastener which fastens the pedestal and the cover together while the mounting substrate is interposed between the pedestal and the cover. The plurality of light-emitting elements are mounted so as to surround the cover.

Moreover, in one aspect of the illumination light source according the present invention, the plurality of light-emitting elements may be arranged in an annular shape in a peripheral portion of the mounting substrate, and the cover may be disposed in a region interior to the plurality of light-emitting elements arranged in the annular shape.

Moreover, in one aspect of the illumination light source according the present invention, the cover may have a through-hole for passing through the fastener, and part of the cover may be located on an outer side of the through-hole.

Moreover, in one aspect of the illumination light source according the present invention, the mounting substrate may have a through-hole having diameter that is greater than a diameter of the through-hole in the cover.

Moreover, in one aspect of the illumination light source according the present invention, the mounting substrate may have a through-hole having an opening shaped such that a length of the opening in a first direction is greater than a length of the opening in a second direction perpendicular to the first direction, the first direction being along a straight line passing through a center of the mounting substrate and a center of the through-hole in the mounting substrate.

Moreover, in one aspect of the illumination light source according the present invention, the cover may have a closed-bottom tubular shape, and may include a frame section which has a tubular shape, defines an opening, and is in surface contact with the main surface of the mounting substrate.

Moreover, in one aspect of the illumination light source according the present invention, the frame section may have a sloping side surface, and the opening defined by the frame section may have an area that decreases with distance from the mounting substrate.

Moreover, in one aspect, the illumination light source according the present invention may further include an electrically conductive component disposed on the main surface of the mounting substrate, and the electrically conductive component may be housed under the cover.

Moreover, in one aspect of the illumination light source according the present invention, the electrically conductive component may be at least one of a power supply part which receives external power for causing the plurality of light-emitting elements to emit light, a line which electrically connects the power supply part and the plurality of light-emitting elements, and a protective element which electrostatically protects the plurality of light-emitting elements.

Moreover, in one aspect, the illumination light source according the present invention may further include a power supply part which is disposed on the main surface of the mounting substrate and receives external power for causing the plurality of light-emitting elements to emit light, and the cover may include a holding part which holds down a connector of a lead connected to the power supply part.

Moreover, in one aspect of the illumination light source according the present invention, the cover may be configured such that part of the frame section spreads outward when the cover is fastened by the fastener.

Moreover, in one aspect of the illumination light source according the present invention, the cover may be plate-shaped and in surface contact with the main surface of the mounting substrate.

Moreover, in one aspect of the illumination light source according the present invention, the cover may also function as a lens.

Moreover, in one aspect of the illumination light source according the present invention, the cover may include a recessed portion that houses an end portion of the fastener.

Moreover, in one aspect of the illumination light source according the present invention, the fastener may be a screw.

Moreover, in one aspect of the illumination light source according the present invention, the plurality of light-emitting elements may be a plurality of light-emitting diode chips mounted directly on the mounting substrate, and a sealing member may be formed on the mounting substrate and collectively seals the plurality of light-emitting diode chips.

Moreover, in one aspect of the illumination light source according the present invention, the plurality of light-emitting elements may each include a container having a cavity, a light-emitting diode chip mounted in the cavity, and a sealing member filling the cavity.

Moreover, in one aspect of the illumination light source according the present invention, the sealing member may include a wavelength converting material which converts a wavelength of light emitted by the plurality of light-emitting diode chips.

Moreover, in one aspect, the illumination device according to the present invention may include the illumination light source according to any one of the foregoing aspects.

Advantageous Effects of Invention

According to the present invention, when a mounting substrate on which light-emitting elements are mounted is fixed to a pedestal, degradation of light distribution properties can be inhibited, and warping, cracking, and splitting of the mounting substrate can be inhibited.

DESCRIPTION OF EMBODIMENTS

Figure 1:
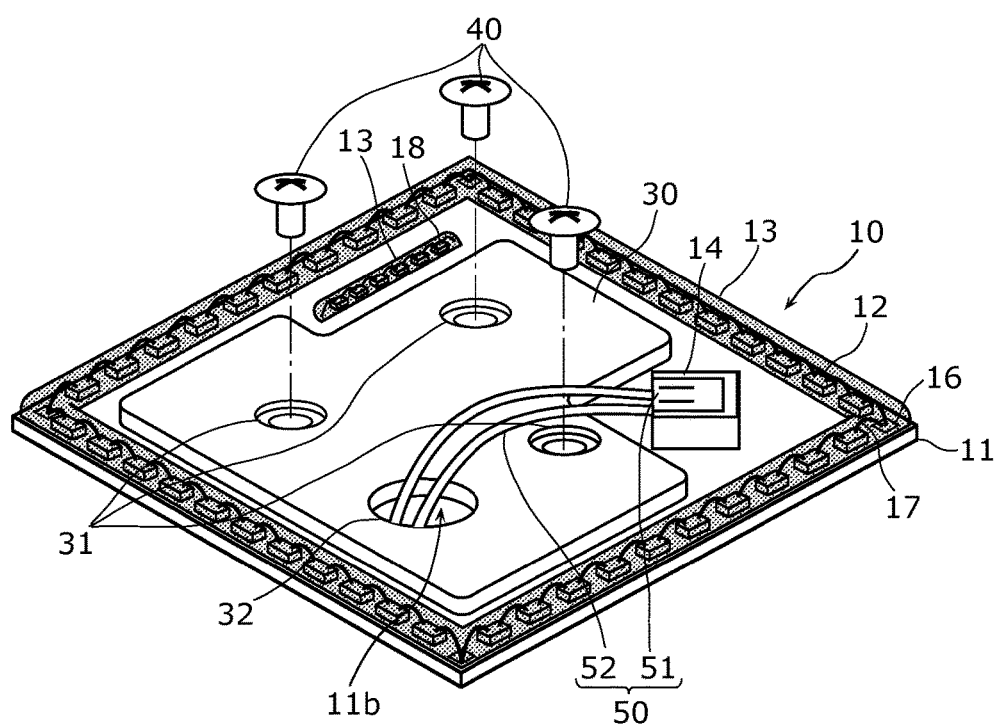
FIG. 1 is a perspective view of the vicinity of a light-emitting device in an illumination light source according to Embodiment 1 of the present invention.

Hereinafter the illumination light source and illumination device according to embodiments of the present invention will be described with reference to the drawings. It should be noted that each of the following embodiments shows one specific preferred example of the present invention. The numerical values, shapes, materials, structural elements, the arrangement and connection of the structural elements etc. shown in the following embodiments are mere examples, and therefore do not limit the present invention. As such, among the structural elements in the following embodiments, elements not recited in any one of the independent claims which indicate the broadest concepts of the present invention are described as arbitrary structural elements.

Note that the respective figures are schematic diagrams and are not necessarily precise illustrations. Additionally, similar structural elements share like reference numbers in the drawings.

Embodiment 1

First, the vicinity of the light-emitting device in the illumination light source according to Embodiment 1 of the present invention will be described with reference to FIG. 1 and FIG. 2.

FIG. 1 is a perspective view of the vicinity of the light-emitting device in the illumination light source according to Embodiment 1 of the present invention. In FIG. 2, (a) is a plan view of the vicinity of the light-emitting device in the same illumination light source, and (b) is a cross sectional view of the vicinity of the light-emitting device in the same illumination light source, taken along line A-A' in (a).

Note that although the configuration of the entire illumination light source is not illustrated, examples of the illumination light source include an LED lamp such as a bulb-shaped LED lamp (LED bulb).

As illustrated in FIG. 1, the illumination light source according to Embodiment 1 includes a light-emitting device 10 as the light source, a pedestal 20 on which the light-emitting device 10 is placed, a cover 30 attached to the light-emitting device 10, and a fastener 40 that fastens the pedestal 20 and the cover 30 together while the light-emitting device 10 is interposed between the pedestal 20 and the cover 30.

The light-emitting device 10 according to Embodiment 1 is a COB light-emitting device, where each of the LEDs 12 is a bare chip and directly mounted on the mounting substrate 11.

(Light-Emitting Device)

As illustrated in FIG. 1, the light-emitting device 10 includes a mounting substrate 11, a plurality of LEDs 12 mounted on the main surface of the mounting substrate 11, a sealing member 13 sealing the LEDs 12, and a power supply part 14 which supplies electricity to the LEDs 12. The light-emitting device 10 further includes a line 15 and pads 16 patterned in predetermined shapes on the mounting substrate 11, wires 17 connected to the LEDs 12, and protective elements 18 which electrostatically protect the LEDs 12.

The mounting substrate 11 is an LED mounting substrate for mounting the LEDs 12, and is disposed on the pedestal 20. The mounting substrate 11 according to Embodiment 1 is a circuit board on which a line 15 is formed.

The mounting substrate 11 has first through-holes 11a passing therethrough. The first through-holes 11a are openings for passing through the fasteners 40. The first through-holes 11a are located in the region interior to the sealing member 13 (the inner region), and can be formed in, for example, three locations in the mounting substrate 11.

The mounting substrate 11 also has a second through-hole 11b passing therethrough. The second through-hole 11b is an opening for passing through a lead 50 to be connected to the power supply part 14. The second through-hole 11b is located in the region interior to the sealing member 13 (the inner region), and is formed in, for example, the central portion of the mounting substrate 11.

In Embodiment 1, the first through-holes 11a and the second through-hole 11b are both formed in the inner region interior to the sealing member 13 formed in an annular shape. The first through-holes 11a and the second through-hole 11b are formed by, for example, laser cutting the ceramic substrate.

The LEDs 12 are mounted in plurality in an annular shape on the main surface of the mounting substrate 11. The LEDs 12 on the mounting substrate 11 are mounted so as to surround the cover 30. In Embodiment 1, the plurality of LEDs 12 are aligned in a single annular element line so as to form a square frame shape (shape of an outline of a square).

Moreover, the LEDs 12 are arranged along the peripheral portion of the mounting substrate 11. More specifically, the LEDs 12 are arranged in a single line along each of the four edges of the square mounting substrate 11, in the vicinity of the edges.

The sealing member 13 is annularly formed along each line of the LEDs 12, so as to cover the LEDs 12. In Embodiment 1, since the plurality of LEDs 12 are arranged in a line that forms a square frame shape, the sealing member 13 is formed in a linear shape along the square line of the LEDs 12.

The sealing member 13 is formed continuously, without interruption, so as to collectively seal all of the LEDs 12. Since the sealing member 13 includes a phosphor in Embodiment 1, the sealing member 13, which seals the LEDs 12, functions as a light-emitting part. In other words, the sealing member 13, which seals the LEDs 12, functions as an annular light-emitting part, and, for example, white light emits from the sealing member 13.

Moreover, the region interior to the annular sealing member 13, which seals the LEDs 12, is defined as an inner region, and the power supply part 14 is disposed in the inner region. In other words, the power supply part 14 is disposed in a region surrounded by the annular light-emitting part. Note that in Embodiment 1, the line 15 is also disposed in the inner region interior to the annular sealing member 13. The protective elements 18 are also disposed in the inner region interior to the annular sealing member 13.

Note that detailed descriptions of each structural element in the light-emitting device 10 will be given later.

(Pedestal)

The pedestal 20 is a support base that supports the light-emitting device 10, and is disposed in a housing, such as the housing of an LED lamp. The light-emitting device 10 is disposed on and fixed to the pedestal 20. The pedestal 20 includes a placing surface for placing the light-emitting device 10. As illustrated in (b) in FIG. 2, the mounting substrate 11 of the light-emitting device 10 is placed on the placing surface of the pedestal 20.

Moreover, the pedestal 20 also functions as a heat sink that dissipates heat generated by the light-emitting device 10. As such, the pedestal 20 preferably includes a metal material such as aluminum or a resin material having a high rate of thermal conductivity.

The pedestal 20 has fixing holes 20a for fixing the fasteners 40. For example, when the fasteners 40 are screws, the fixing holes 20a are threaded screw holes into which the screws are screwed. As illustrated in (b) in FIG. 2, the fixing holes 20a are formed so as to positionally correspond to the first through-holes 11a in the mounting substrate 11 and first through-holes 31 in the cover 30.

The pedestal 20 also has an insertion hole for passing through the lead 50 to be connected to the power supply part 14. The insertion hole is formed so as to positionally correspond to the second through-hole 11b in the mounting substrate 11 and a second through-hole 32 in the cover 30.

(Cover)

The cover 30 covers a partial region of the main surface of the mounting substrate 11. The cover 30 according to Embodiment 1 is a plate-shaped component of a predetermined shape, and the entire surface of the cover 30 facing the mounting substrate 11 is in surface contact with the main surface of the mounting substrate 11. The cover 30 can be made from, for example, a resin having electrically insulating properties, such as polybutylene terephthalate (PBT).

The cover 30 is disposed in the region interior to the element line of the LEDs 12 arranged in the annular shape. In Embodiment 1, since the LEDs 12 arranged in the annular shape are collectively sealed by the sealing member 13, the cover 30 is disposed in the inner region interior to the annular sealing member 13. In other words, the cover 30 is disposed in a region surrounded by the annular light-emitting part.

The cover 30 has first through-holes 31. The fasteners 40 pass through the first through-holes 31, and the first through-holes 31 engage with and hold the fasteners 40. The first through-holes 31 are located in the region interior to the annular sealing member 13 (i.e., in the inner region), and can be formed in, for example, three locations on the cover 30, as illustrated in (a) in FIG. 2. As illustrated in (b) in FIG. 2, the first through-holes 31 re formed so as to positionally correspond to the fixing holes 20a of the pedestal 20 and the first through-holes 11a of the mounting substrate 11.

Moreover, each first through-holes 31 has a structure that holds the head of the screw. In other words, each first through-holes 31 is configured such that the entire fastener 40 does not pass through the first through-hole 31. When the fastener 40 is a screw, each first through-hole 31 may include a structure that catches the head of the screw so that the head of the screw does not pass through the first through-hole 31. In this case, the cover 30 preferably includes a recessed portion that houses an end portion of the fastener 40.

Figure 2:
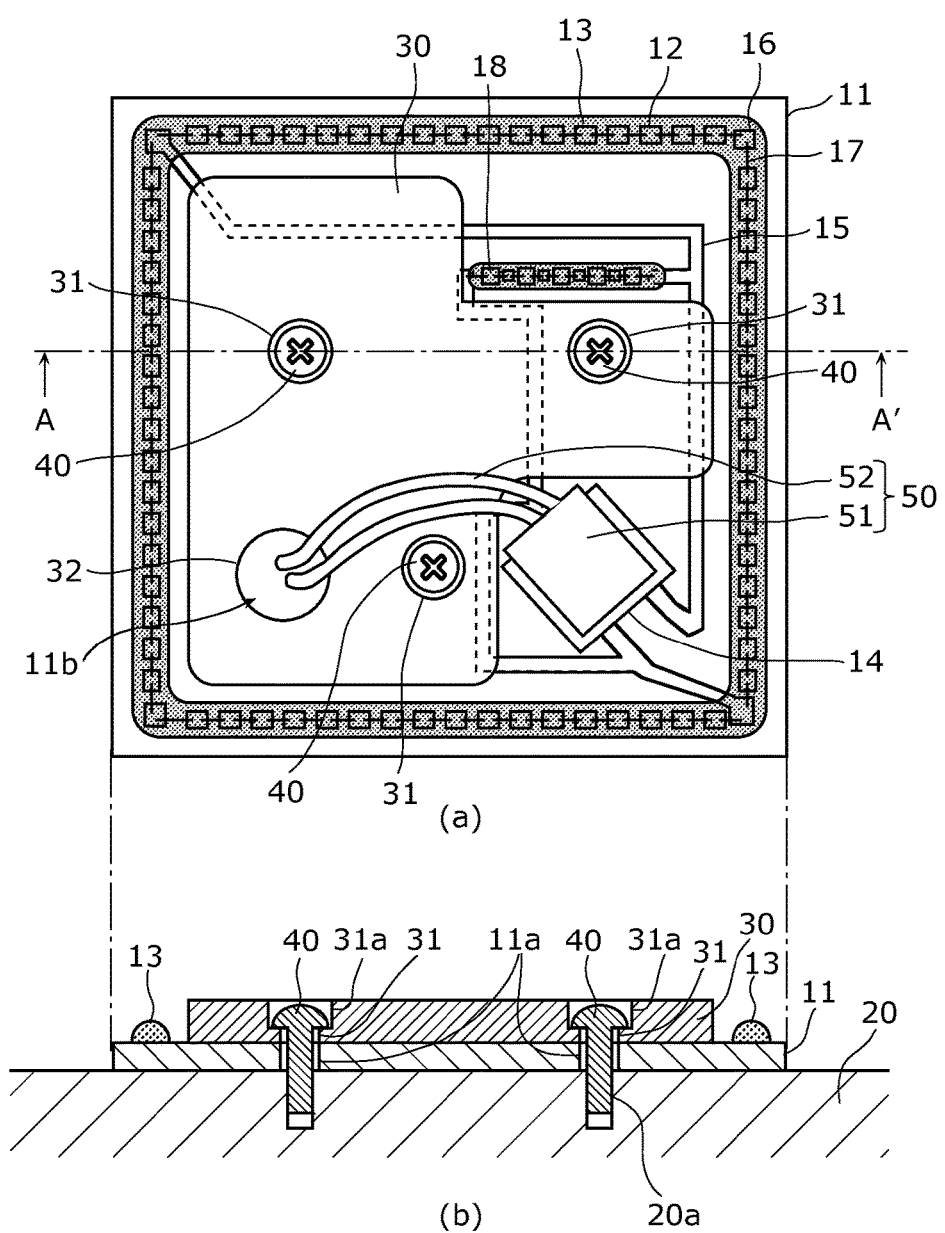
In FIG. 2, (a) is a plan view of the vicinity of a light-emitting device in an illumination light source according to Embodiment 1 of the present invention, and (b) is a cross sectional view of the vicinity of the light-emitting device in the same illumination light source, taken along line A-A' in (a).

In Embodiment 1, as illustrated in (b) in FIG. 2, each first through-hole 31 includes a housing part (counterbore hole) 31a for housing the screw head and a stepped part for catching the head of the screw. In other words, the first through-hole 31 is configured to have two different diameters, where the smaller diameter portion is smaller in diameter than the head of the screw.

The cover 30 also has a second through-hole 32. The second through-hole 32 is an opening for passing through the lead 50 to be connected to the power supply part 14. The second through-hole 32 is located in the region interior to the sealing member 13 (the inner region). The second through-hole 32 positionally corresponds to the insertion hole of the pedestal 20 and the second through-hole 11b of the mounting substrate 11.

The cover 30 preferably covers a wide area of the main surface of the mounting substrate 11, in the inner region of the annular sealing member 13, and at least part of the cover 30 is preferably located on an outer side of each first through-hole 31.

As illustrated in (a) in FIG. 2, the cover 30 according to Embodiment 1 covers, among the inner region interior to the annular sealing member 13, a region excluding the surrounding area of the sealing member 13 covering the protective elements 18 and the surrounding area of the power supply part 14. In other words, the cover 30 is formed so as to avoid the power supply part 14 and the sealing member 13 covering the protective elements 18. With this, the line 15 formed on the mounting substrate 11 can largely be covered by the cover 30.

(Fastener)

The fastener 40 is a component for fastening the pedestal 20 and the cover 30 together while the mounting substrate 11 is disposed between the pedestal 20 and the cover 30. The fastener 40 makes it possible to fasten the cover 30 and the mounting substrate 11 to the pedestal 20 to fix the cover 30 and the mounting substrate 11 to the pedestal 20. Note that when the fixing hole 20a of the pedestal 20 is a through-hole, a bolt and nut may be used as the fastener 40.

As a specific example of the fastening method with the fastener 40, first the opening of the fixing hole 20a of the pedestal 20 and the opening of the first through-hole 11a of the mounting substrate 11 are aligned, and the mounting substrate 11 of the light-emitting device 10 is placed on the pedestal 20. Next, the cover 30 is disposed on the mounting substrate 11 and the opening of the first through-hole 11a of the mounting substrate 11 and the opening of the first through-hole 31 of the cover 30 are aligned. Then, when the fastener 40 is a screw (bolt), the shaft of the screw is passed through the first through-hole 31 of the cover 30 and the first through-hole 11a of the mounting substrate 11, and the threaded portion of the screw is screwed into the fixing hole 20a (nut) of the pedestal 20 until the head of the screw is held by the cover 30. This makes it possible to fix the cover 30 and the mounting substrate 11 to the pedestal 20.

In this state, a pressing force is applied to the mounting substrate 11 by the cover 30. In Embodiment 1, since the plate-shaped cover 30 covers a wide area of the main surface of the mounting substrate 11 in the inner region interior to the annular sealing member 13, the cover 30 is in surface contact with a wide area of the mounting substrate 11. With this, a pressing force can be applied to the mounting substrate 11 over a wide area of the inner region interior to the annular sealing member 13.

(Lead)

The lead 50 is a power supply lead for supplying power to the light-emitting device 10, and includes, for example, a connector 51 for attachment to the socket of the power supply part 14, and a pair of electrically conductive wires 52 connected to the connector 51.

The connector 51 includes an approximately rectangular resin molded part formed so as to mate with the socket of the power supply part 14, and an electrically conductive part provided on the resin molded part. Moreover, the pair of electrically conductive wires 52 can be vinyl-covered wires including a metal core covered by a resin coating, for example. In Embodiment 1, the lead 50 is configured to provide DC power, and the pair of electrically conductive wires 52 include a positive voltage supply wire for supplying positive voltage and a negative voltage supply wire for supplying negative voltage.

Note that the lead 50 is not required to include the connector 51; for example, the lead 50 may be formed as only the pair of vinyl-covered wires. In this case, the power supply part 14 is formed as a pair of metal electrodes (metal films), and the metal core wires exposed at the ends of the pair of leads (vinyl-covered wires) are soldered to the pair of power supply parts 14 to electrically connect the power supply parts 14 and the leads (vinyl-covered wires).

Hereinafter, each structural element in the light-emitting device 10 according to Embodiment 1 will be described in detail with reference to FIG. 1 and FIG. 2.

(Substrate)

As illustrated in (a) in FIG. 2, a substrate having a square shape in a plan view (i.e., when viewed in a direction perpendicular to the main surface of the mounting substrate 11) can be used as the mounting substrate 11, for example. Note that the plan view shape of the mounting substrate 11 is not limited to a square shape, and may be a polygonal shape, namely, a quadrilateral shape such as a rectangle, a hexagon, or an octagon; a circular shape; or another shape.

An electrically insulated substrate such as a ceramic substrate made of ceramic, a resin substrate made of resin, or a glass substrate may be used as the mounting substrate 11 and, alternatively, a metal based substrate made of a metal plate covered with an electrically insulating film (metal substrate) may be used as the mounting substrate 11.

The ceramic substrate may be made of, for example, aluminum oxide (alumina) or aluminum nitride. The resin substrate may be, for example, a rigid substrate such as a glass epoxy substrate, or a flexible substrate made of, for example, polyimide. The metal based substrate is, for example, an aluminum alloy substrate, an iron alloy substrate, or a copper alloy substrate.

A white substrate having a high optical reflectivity (for example, an optical reflectivity of 90% or higher) is preferably used as the mounting substrate 11. Using a white substrate allows for light from the LEDs 12 to be reflected off the surface of the mounting substrate 11, thereby increasing the light extraction rate of the light-emitting device 10.

In Embodiment 1, a ceramic substrate is used as the mounting substrate 11. Ceramic substrates have a higher rate of heat conductivity than resin substrates, and can therefore efficiently radiate heat from the LEDs 12. Moreover, ceramic substrates have a low rate of degradation over time, and also have excellent heat resistance properties.

More specifically, a white polycrystalline alumina substrate (polycrystalline ceramic substrate) formed of sintered alumina particles and having a thickness of approximately 1 mm may be used as the mounting substrate 11. Polycrystalline alumina substrates can be manufactured by pressure forming by adding a binder to a mixture of alumina particles (base material) and a scattering substance or a sintering additive (additive agent), and then sintering the result. Note that due to the sintering, the size of the grains of the base material, alumina particles, increase in the crystallization.

(LEDs)

The LEDs 12 are one example of the light-emitting elements, and are semiconductor light-emitting elements that emit light in response to predetermined power. LEDs having the same If properties can be used for the plurality of LEDs 12 on the mounting substrate 11, but each LED 12 may have slightly different If properties, so long as the total If for the whole line of LEDs 12 connected in series is within a predetermined margin. Moreover, each LED 12 is a bare chip that emits monochromatic visible light, and in Embodiment 1, a blue LED chip that emits blue light when energized is used for the LED 12. A gallium nitride semiconductor light-emitting element formed from Incan material, for example, and having a central wavelength of 440 nm to 470 nm, can be used as the blue LED chip.

Moreover, in Embodiment 1, each LED 12 has a rectangular shape in a plan view (i.e., when viewed in a direction perpendicular to the main surface of the mounting substrate 11). Here, the LEDs 12 are preferably arranged such that long sides of the rectangular shape of the LEDs 12 are approximately parallel with the adjacent side of the polygon shape of the mounting substrate 11. In other words, the LEDs 12 are preferably arranged such that long sides of the LEDs 12 are aligned with the adjacent edge of the mounting substrate 11. For example, when the mounting substrate 11 has a square shape in a plan view, each LED 12 may be arranged such that the long side of the rectangular shape of the LED 12 and one side of the square shape of the mounting substrate 11 are parallel to each other.

By arranging the LEDs 12 in this orientation, the luminous flux of light emitted in a direction perpendicular to the direction in which adjacent LEDs 12 are aligned (i.e., perpendicular to the direction in which the sealing member 13 is applied), that is to say, the luminous flux of light emitted from the long sides of the LEDs 12 increases, thereby increasing the light extraction rate.

Moreover, each LED 12 has a p-side electrode (not shown in the Drawings) and an n-side electrode (not shown in the Drawings), and a wire 17 is connected to the p-side electrode and a wire 17 is connected to the n-side electrode. In Embodiment 1, at each edge of the mounting substrate 11, adjacent LEDs 12 are directly connected by the wire 17. In other words, the LEDs 12 at each edge of the mounting substrate 11 are wire bonded in a chip-to-chip configuration, and among two adjacent LEDs 12, the cathode of one LED 12 is connected with the anode of the other LED 12 by the wire 17.

(Sealing Member)

The sealing member 13 can be made from, for example, a light-transmissive resin material and, if the wavelength of the light from the LEDs 12 is to be converted to a predetermined wavelength, can be mixed with a wavelength converting material. The sealing member 13 according to Embodiment 1 includes a phosphor as the wavelength converting material, and is a wavelength converting member that converts the wavelength (color) of the light emitted by the LEDs 12. The sealing member 13 can be made from an electrically insulating resin material (phosphor-containing resin) containing phosphor particles. The phosphor particles are excited by the light emitted from the LEDs 12 and emit light of a desired color (wavelength).

Silicon resin, for example, can be used as the resin material for the sealing member 13. Moreover, a light diffusing material may be dispersed in the sealing member 13. Note that the sealing member 13 is not required to be formed from a resin material; the sealing member 13 may be formed from an organic material such as a fluorine based resin or an inorganic material such as glass having a low melting point or sol-gel glass.

When the LEDs 12 are blue LEDs that emit blue light, in order to achieve a white light, YANG yellow phosphor particles, for example, can be used as the phosphor particles contained in the sealing member 13. With this, the wavelength of a portion of the blue light emitted by the LEDs 12 is converted into yellow light by the yellow phosphor particles contained in the sealing member 13. The blue light not absorbed by the yellow phosphor particles and the yellow light converted by the yellow phosphors are diffused and mixed in the sealing member 13, resulting in emission of white light from the sealing member 13. Particles such as silica particles can be used as the diffusing material.

The sealing member 13 according to Embodiment 1 is a phosphor-containing resin formed by dispersing predetermined phosphor particles in a silicon resin, and is applied to the main surface of the mounting substrate 11 with a dispenser and then hardened.

More specifically, the dispensing nozzle of the dispenser is positioned facing a predetermined position on the mounting substrate 11 and is translated in a given direction relative to the mounting substrate 11 while dispensing the sealing member material (phosphor-containing resin) along the direction in which the LEDs 12 are arranged. The sealing member material is dispensed so as to cover the LEDs 12 and the wires 17.

In Embodiment 1, since the sealing member 13 is formed in an annular shape without interruption, the sealing member material is applied in a single operation, starting and ending at the point on the mounting substrate 11, similar to drawing a square shape in a single stroke. After the sealing member material is applied, the sealing member material is hardened using a predetermined method.

Note that the cross sectional shape of the applied sealing member 13 taken along a direction perpendicular to the lengthwise direction of the sealing member 13 is, for example, an approximate semicircle.

The protective elements 18 are also sealed by the sealing member 13. The sealing member 13 can be formed along the row of protective elements 18, and in Embodiment 1, is formed in a straight line. The sealing member 13 covering the protective elements 18 can be formed with the same method and materials used to form the sealing member 13 sealing the LEDs 12. Covering the protective elements 18 with the sealing member 13 inhibits the deterioration of the protective elements 18.

Note that the sealing member 13 covering the protective elements 18 is not required to contain a phosphor, but by using the same material for the sealing member 13 sealing the protective elements 18 and the sealing member 13 sealing the LEDs 12, the protective elements 18 and the LEDs 12 can be sealed in the same process. This reduces manufacturing costs.

(Power Supply Part)

The power supply part 14 (power supply terminal) is an external connection terminal (electrode terminal) that receives predetermined power from outside the light-emitting device 10. In Embodiment 1, the power supply part 14 receives DC power for causing the LEDs 12 to emit light, and supplies the received DC power to each LED 12 via the line 15 and the wires 17. Note that the received DC power is also supplied to the protective elements 18.

The power supply part 14 is a socket receptacle, and includes a resin socket and a plurality of electrically conductive pins for receiving DC power. The plurality of electrically conductive pins include a positive voltage electrically conductive pin and a negative voltage electrically conductive pin that are electrically connected to the line 15 formed on the mounting substrate 11.

The power supply part 14 receives power as a result of the connector 51 of the power supply lead 50 being connected to the socket of the power supply part 14.

Note that instead of a socket receptacle, a metal electrode may be used as the power supply part 14. In this case, the metal electrode may include a positive voltage metal electrode and a negative voltage metal electrode, and can be patterned at the same time as the line 15, for example.

(Line)

The line 15 is formed for electrically connecting the plurality of LEDs 12 and the power supply part 14. In other words, the line 15 can be an electrically conductive line through which current for causing the LEDs 12 to emit light flows, such as a metal line. Power fed to the light-emitting device 10 is supplied to the LEDs 12 via the line 15.

As illustrated in (a) in FIG. 2, the line 15 can be formed in a predetermined shape such that the plurality of LEDs 12 on the mounting substrate 11 are electrically connected in a predetermined configuration. In Embodiment 1, the line 15 is patterned so as to configure all of the LEDs 12 in a configuration of both series and parallel connections.

Moreover, the line 15 is also formed for electrically connecting the protective elements 18 and the power supply part 14. Moreover, the line 15 is also formed as islands between each protective element 18, and the protective elements 18 and the islands of the line 15 are connected by wires 17.

The line 15 can be formed by patterning or printing a metal film of a metal material, for example. Gold (Au), silver (Ag), and copper (Cu), for example, can be used for the metal material for the line 15. The line 15 according to Embodiment 1 is formed from gold.

Note that the portion of the line 15 exposed from the sealing member 13 is preferably covered by a glass film (glass coating film) of a glass material, or a resin film (resin coating film) of a resin material. This makes it possible to increase the electrical insulation properties of the light-emitting device 10 and increase the reflectivity of the surface of the mounting substrate 11.

(Pads)

The pads 16 are electrically connected to the plurality of LEDs 12 and the line 15. The pads 16 are formed in corners (corner portions) of the shape in which the LEDs 12 are arranged. In other words, when the LEDs 12 are arranged in a polygonal shape in a plan view of the mounting substrate 11, the pads 16 are formed in the corners of the polygonal shape. In other words, the pads 16 are disposed so as to become part of the same line of LEDs 12, and each pad 16 disposed in each corner along with the plurality of LEDs 12 disposed to correspond with the edges collectively form the polygonal shape. For example, when the shape in which the LEDs 12 are arranged is a square, the pads 16 are formed in the four corners of the square.

Moreover, in Embodiment 1, since the shape in which the LEDs 12 are arranged and the shape of the mounting substrate 11 are both squares, the pads 16 are formed in positions corresponding to the corners of the mounting substrate 11. In other words, since the mounting substrate 11 is square in a plan view, the pads 16 are formed in the four corners of the square shape.

In this way, by forming the pads 16 in the corners of the mounting substrate 11, it is possible to reduce the number of changes in the direction (angle) of application needed to be made at the corner when applying the sealing member 13. This makes it possible to simplify the application process of the sealing member 13 and thus reduce manufacturing costs. Moreover, by connecting the two LEDs 12 disposed near a corner via the pad 16 with wire 17, unlike when the two LEDs 12 are directly connected with wire, the wire 17 is not disposed further interior to the mounting substrate 11 from the direction of each chip group.

In other words, when the LEDs 12 at a corner of the mounting substrate 11 are directly connected with wire, without a pad 16 interposed therebetween, the wire 17 is pulled diagonally. In this case, in a corner of the mounting substrate 11, when the sealing member 13 is applied with one angle change (90°), the wire 17 protrudes out from the sealing member 13. Note that in order to keep the wire 17 from protruding out, at the corners, the sealing member 13 must be applied so as to have a curve or applied with two angle changes since the wire 17 is pulled inward toward the interior, hindering the simplified application of the sealing member 13.

Consequently, in Embodiment 1, the wires are connected using the pads 16 at the corners of the mounting substrate 11. Since this makes it possible to inhibit the wire from protruding out from the sealing member 13, a decrease in the uniformity of luminance resulting from the protruding wire can be inhibited.

(Wire)

The wire 17 is, for example, an electrically conductive wire such as a gold wire. As described above, at each edge of the mounting substrate 11, the wire 17 directly connects adjacent LEDs 12 together. Moreover, as described above, at each corner of the mounting substrate 11, the wire 17 is installed across the LEDs 12 and the pads 16. The wires 17 are preferably embedded within the sealing member 13 so as not to be exposed from the sealing member 13.

(Protective Element)

The protective element 18 prevents breakdown of the LEDs 12—which have a low peak inverse voltage—due to static electricity of a reverse polarity forming on the mounting substrate 11. As such, the protective element 18 is disposed so as to be connected in parallel in a reverse polarity with respect to the LEDs 12.

A zener diode, for example, can be used as the protective element 18. Moreover, one or more protective elements 18 may be mounted on the mounting substrate 11. As illustrated in FIG. 1 and FIG. 2, in Embodiment 1, five zener diodes are mounted as protective elements 18.

In Embodiment 1, the protective elements 18 are sealed by the sealing member 13. The sealing member 13 can be formed along the row of protective elements 18, and in Embodiment 1, is formed in a straight line. The sealing member 13 covering the protective elements 18 can be formed with the same method and materials used to form the sealing member 13 sealing the LEDs 12. Covering the protective elements 18 with the sealing member 13 inhibits the deterioration of the protective elements 18.

Note that the sealing member 13 covering the protective elements 18 is not required to contain a phosphor, but by using the same material for the sealing member 13 sealing the protective elements 18 and the sealing member 13 sealing the LEDs 12, the protective elements 18 and the LEDs 12 can be sealed in the same process. This reduces manufacturing costs.

With the illumination light source according to Embodiment 1, the mounting substrate 11 of the light-emitting device 10 is fastened and fixed to the pedestal 20 by the fastener 40 via the cover 30. More specifically, when a screw is used as the fastener 40, the shaft of the screw is inserted through the first through-hole 31 of the cover 30 and the first through-hole 11a of the mounting substrate 11 and the screw is screwed into the fixing hole 20a of the pedestal 20 such that the head of the screw engages with and is held by the cover 30.

In this way, in Embodiment 1, the mounting substrate 11 is not directly screwed to the pedestal 20, but the mounting substrate 11 is fastened and fixed to the pedestal 20 via the cover 30. In other words, in Embodiment 1, the mounting substrate 11 is not fixed at a certain point such as directly being screwed down, but fixed by being sandwiched by a surface using the cover 30.

This makes it possible to inhibit warping of the mounting substrate 11 even when the mounting substrate 11 is a resin substrate or a metal substrate since the load beared by the mounting substrate 11 is spread evenly across a wide area. This makes it possible to inhibit a reduction the contactability between the mounting substrate 11 and the pedestal 20.

Moreover, in Embodiment 1, since the mounting substrate 11 and the cover 30 are brought into surface contact, it is possible to keep the load from concentrating in one location, such as is the case when directly fastening the mounting substrate 11 with a screw. This makes it possible to disperse the load across the entire area of contact between the cover 30 and the mounting substrate 11. Thus, even when a ceramic substrate is used as the mounting substrate 11, it is possible to inhibit cracking and splitting of the ceramic substrate.

Moreover, in Embodiment 1, the LEDs 12 are mounted so as to surround the cover 30. In other words, the cover 30 is mounted in the region interior to the annularly arranged LEDs 12. With this, light emitted from the sides of the light-emitting part (LEDs 12, sealing member 13) outward toward the edges of the mounting substrate 11 is not blocked by the cover 30, and as such, a reduction in light emission efficiency and degradation of the light distribution characteristics due to an uneven luminance distribution can be inhibited.

Moreover, in Embodiment 1, the LEDs 12 are arranged along the peripheral portion of the mounting substrate 11. This configuration increases the heat dissipating properties and light emission efficiency since the plurality of LEDs 12 are dispersedly arranged at the peripheral portion of the mounting substrate 11 rather than being densely arranged. Moreover, in Embodiment 1, since the LEDs 12 are arranged in an annular line, it is possible to further inhibit a reduction in heat dissipating properties and light emission efficiency due to the LEDs 12 being densely arranged.

Moreover, by arranging the LEDs 12 at the peripheral portion of the mounting substrate 11, the heat transfer path from the LEDs 12 to outside the mounting substrate 11 can be shortened, thereby further increasing the heat dissipating properties. Furthermore, since the LEDs 12 are arranged along the peripheral portion of the mounting substrate 11, the light-emitting part (LEDs 12, sealing member 13) is formed at the peripheral portion of the mounting substrate 11. Consequently, a light-emitting device capable of further inhibiting a reduction in light emission efficiency and having a more even luminance distribution can be achieved since no obstruction that reflects or absorbs light emitted from the light-emitting part is arranged in the region exterior to the light-emitting part.

Moreover, in Embodiment 1, at least part of the cover 30 is located on an outer side of each first through-hole 31. With this, since part of the cover 30 is present on an outer side of each first through-hole 31, the cover 30 can cover a wide area of the main surface of the mounting substrate 11 in the inner region interior to the annular sealing member 13. Moreover, in Embodiment 1, the light-emitting part (LEDs 12, sealing member 13) is formed along the peripheral portion of the mounting substrate 11. This makes it possible to enlarge the cover 30 to a size that reaches the peripheral portion of the mounting substrate 11. As a result, the area of the mounting substrate 11 up to the peripheral portion can be held down by the cover 30, making it possible to further inhibit the outer perimeter of the mounting substrate 11 from warping and the central portion of the mounting substrate 11 from separating from contact.

Moreover, in Embodiment 1, the first through-holes 31 of the cover 30 and the first through-holes 11a of the mounting substrate 11 are preferably located in the region interior to the annular light-emitting part (LEDs 12, sealing member 13). With this, the fasteners 40 that are inserted through the first through-holes 31 and the first through-holes 11a are also disposed in the region interior to the annular light-emitting part. Thus, light emitted from the light-emitting part outward toward the edges of the mounting substrate 11 is not affected by the fasteners 40. In other words, a component which shields light and casts a shadow is not disposed in the region exterior to the light-emitting part. Consequently, a more even luminance distribution can be achieved.

Moreover, in Embodiment 1, since each first through-hole 31 of the cover 30 includes a recessed portion that houses the end portion of the fastener 40 (i.e., the head of the screw), absorption of light by the fastener 40 can be inhibited. With this, a more even luminance distribution can be achieved and the light extraction rate can be increased.

Furthermore, disposing the fasteners 40 in the inner region interior to the light-emitting part eliminates the need to dispose a fixing member for fixing the mounting substrate 11 outside the mounting substrate 11. In other words, this eliminates the need to use a holding member that extends across the peripheral portion of the mounting substrate 11 and the pedestal 20. With this, a compact illumination light source including the light-emitting device 10 can be achieved.

Moreover, in Embodiment 1, the line 15 for electrically connecting the power supply part 14 and the LEDs 12 is preferably located in the region interior to the annular light-emitting part (LEDs 12, sealing member 13). With this configuration, light emitted from the light-emitting part outward toward the edges of the mounting substrate 11 can be inhibited from being absorbed by or reflected off the line 15. As a result, a more even luminance distribution can be achieved and the light extraction rate can be increased.

Moreover, in Embodiment 1, the majority of the line 15 on the mounting substrate 11 is covered by the cover 30. With this configuration, light emitted from the light-emitting part can be substantially inhibited from being absorbed by or reflected off the line 15. As a result, a more even luminance distribution can be achieved and the light extraction rate can be increased.

Moreover, in Embodiment 1, the power supply part 14 and the protective elements 18 are preferably located in the region interior to the annular light-emitting part (LEDs 12, sealing member 13). With this configuration, light emitted from the sides of the light-emitting part outward toward the edges of the mounting substrate 11 can be inhibited from being absorbed by the power supply part 14 and the protective element 18, resulting in a decrease in light emission efficiency, or from being reflected off the power supply part 14 and the protective element 18, resulting in an uneven luminance distribution.

Moreover, in Embodiment 1, the second through-hole 32 of the cover 30 and the second through-hole 11b of the mounting substrate 11 for passing through the lead 50 are preferably located in the region interior to the annular light-emitting part (LEDs 12, sealing member 13). This makes it possible to pass the lead 50 through the second through-hole 11b and the second through-hole 32 formed interior to the light-emitting part and connect the lead to the power supply part 14 when the lead 50 is to be connected to the power supply part 14. With this, light emitted from the light-emitting part outward toward the edges of the mounting substrate 11 is not affected by the lead. In other words, the lead, which casts a shadow, is not located in the region exterior to the light-emitting part. Consequently, a more even luminance distribution can be achieved.

Moreover, by routing the lead 50 through the second through-hole 11b and the second through-hole 32 located in the inner region interior to the light-emitting part, there is no need to extend the lead 50 to the region exterior to the light-emitting part. With this, it is possible to achieve an even more compact illumination light source including the light-emitting device 10, compared to when the power supply part 14 is disposed at the peripheral portion of the mounting substrate 11 and the lead 50 is connected to such a power supply part 14.

Moreover, in Embodiment 1, the sealing member 13 is preferably formed in line shape collectively covering the LEDs 12 arranged in an annular line. With this configuration, light can be emitted in a continuous, linear shape.

Moreover, in Embodiment 1, the sealing member 13 is preferably formed continuously, without interruption. This achieves an even, linear emission of light that is continuous around the entire perimeter of the mounting substrate 11. Consequently, a more even luminance distribution can be achieved.

Figure 3:
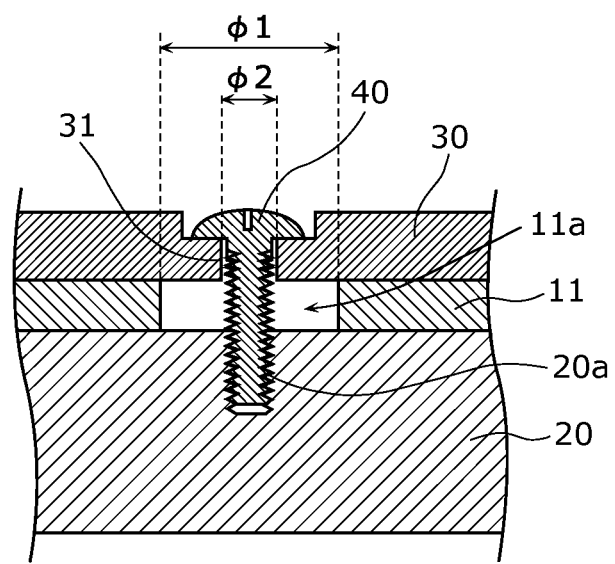
FIG. 3 illustrates the vicinity of a first through-hole formed in a mounting substrate in an illumination light source according to Variation 1 of Embodiment 1 of the present invention.
Figure 4:
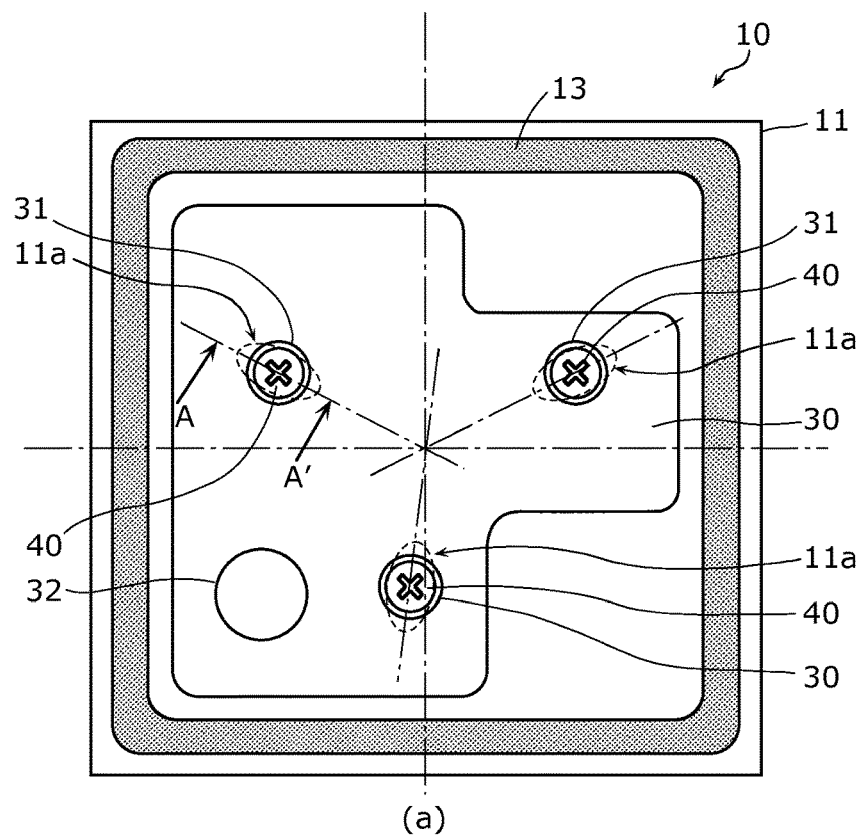
In FIG. 4, (a) is a plan view of a light-emitting device according to Variation 2 of Embodiment 1 of the present invention, and (b) illustrates the vicinity of a first through-hole formed in the mounting substrate in the same illumination light source.
Figure 4:
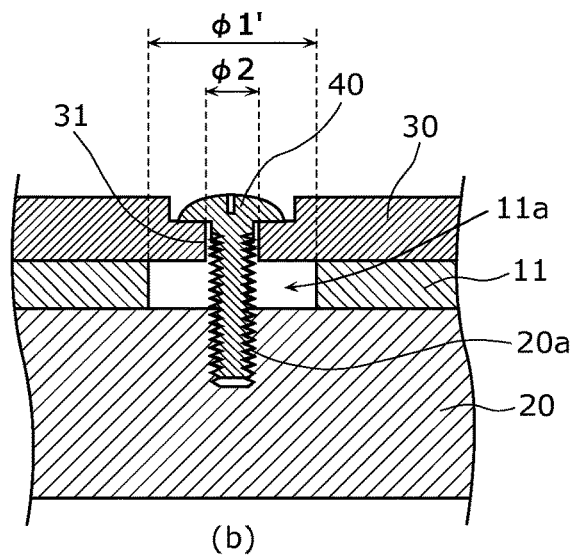

Next, the preferred shape of the first through-hole 11a formed in the mounting substrate 11 will be described with reference to FIG. 3 and FIG. 4. FIG. 3 illustrates the vicinity of the first through-hole formed in the mounting substrate in the illumination light source according to Variation 1 of Embodiment 1 of the present invention. In FIG. 4, (a) is a plan view of the light-emitting device according to Variation 2 of Embodiment 1 of the present invention, and (b) illustrates the vicinity of the first through-hole formed in the mounting substrate in the same illumination light source.

The illumination light source illustrated in FIG. 3 differs from the illumination light source illustrated in FIG. 2 in that the diameter of the first through-hole 11a formed in the mounting substrate 11 is larger. More specifically, when the diameter of the first through-hole 11a formed in the mounting substrate 11 is denoted as φ1 and the diameter of the first through-hole 31 formed in the cover 30 is denoted as φ2, the relationship of the diameters is φ1≈φ2 in FIG. 2, whereas the relationship is φ1>φ2 in FIG. 3. In other words, the diameter φ1 of the first through-hole 11a formed in mounting substrate 11 is larger than the diameter φ2 of the first through-hole 31 formed in the cover 30, and the diameter φ1 of the first through-hole 11a formed in mounting substrate 11 is made to be sufficiently larger than the diameter of the shaft of the screw.

The mounting substrate 11 thermally expands or contracts depending on the temperature of its surrounding environment, but by making φ1 greater than φ2, it is possible to alleviate the restraint in the direction horizontal to the main surface of the mounting substrate 11, in the area of the mounting substrate 11 in the vicinity of the first through-hole 11a, and possible to give the mounting substrate 11 some leeway to expand or contract. This can inhibit the mounting substrate 11 from warping due to deformation, and thus inhibit the mounting substrate 11 from cracking or splitting. Moreover, if the mounting substrate 11 is fastened and fixed with, for example, a screw, the expanding and contracting of the mounting substrate 11 due to thermal expansion and contraction places a large load on the fixing part, but by forming φ1 to be greater than φ2, the load can be alleviated. This also makes it possible to inhibit the mounting substrate 11 from cracking or splitting.

Moreover, the opening of the first through-hole 11a formed in the mounting substrate 11 may be shaped so as to have a length in a direction along a straight line passing through the center of the mounting substrate 11 and the center of the first through-hole 11a formed in the mounting substrate 11 (i.e., a first direction) that is greater than a length in a second direction perpendicular to the first direction.

For example, as illustrated in (a) and (b) in FIG. 4, the opening of the first through-hole 11a formed in the mounting substrate 11 can have an elliptical shape having a longitudinal axis along the first direction and a transverse axis along the second direction. In this case, as illustrated in (b) in FIG. 4, when the diameter in the first direction of the first through-hole 11a formed in the mounting substrate 11 is denoted as φ1' and the diameter of the first through-hole 31 formed in the cover 30 is denoted as φ2, the diameters can have a relationship expressed as φ1'>φ2. Note that the diameter in the second direction of the first through-hole 11a formed in the mounting substrate 11 (i.e., the length along the transverse axis) may be equal to the diameter φ2 of the first through-hole 31 formed in the cover 30.

Similar to Variation 1 illustrated in FIG. 3, this can inhibit the mounting substrate 11 from warping due to deformation, and thus inhibit the mounting substrate 11 from cracking or splitting. Note that in Variation 2, the opening of the first through-hole 11a formed in the mounting substrate 11 is not limited to an elliptical shape; the opening may have, for example, a rectangular shape or a race track shape.

Embodiment 2

Next, the vicinity of the light-emitting device in the illumination light source according to Embodiment 2 of the present invention will be described with reference to FIG. 5 and FIG. 6.

Figure 5:
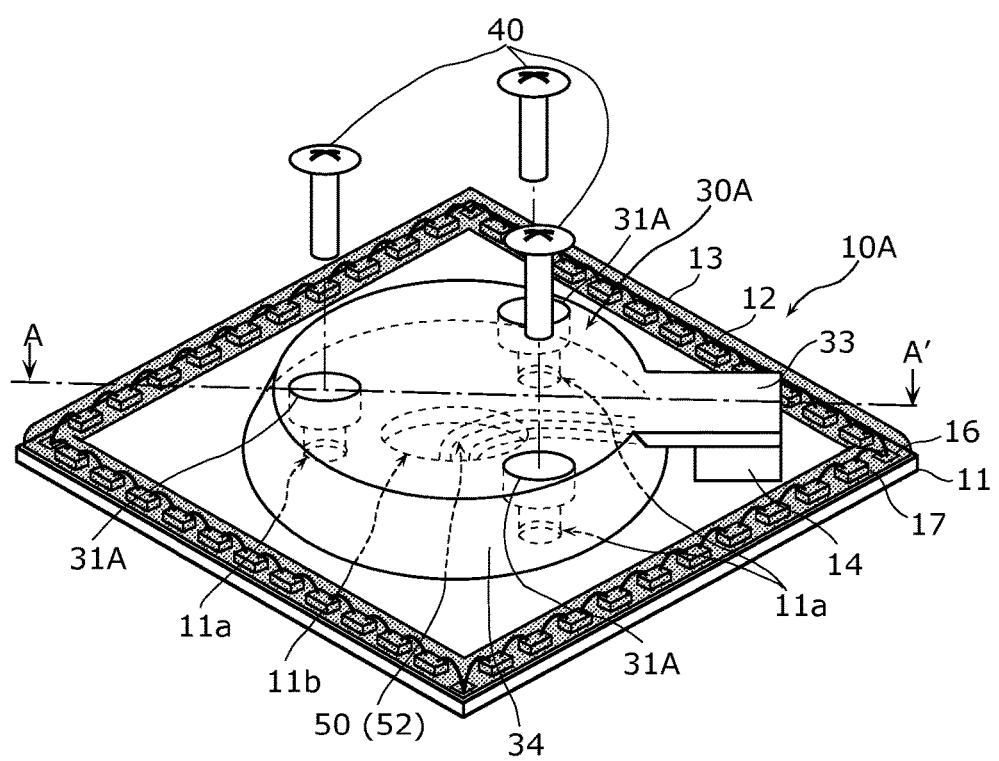
FIG. 5 is a perspective view of the vicinity of a light-emitting device in an illumination light source according to Embodiment 2 of the present invention.

FIG. 5 is a perspective view of the vicinity of the light-emitting device in the illumination light source according to Embodiment 2 of the present invention. In FIG. 6, (a) is a partial plan view of the vicinity of the light-emitting device in the same illumination light source, and (b) is a cross sectional view of the vicinity of the light-emitting device in the same illumination light source, taken along line A-A' in FIG. 5. Note that although the configuration of the entire illumination light source is not illustrated, examples of the illumination light source include an LED lamp such as a bulb-shaped LED lamp (LED bulb) in Embodiment 2 as well.

The illumination light source according to Embodiment 2 differs from the illumination light source according to Embodiment 1 in regard to the configurations of the light-emitting device 10A and the cover 30A.

Figure 6:
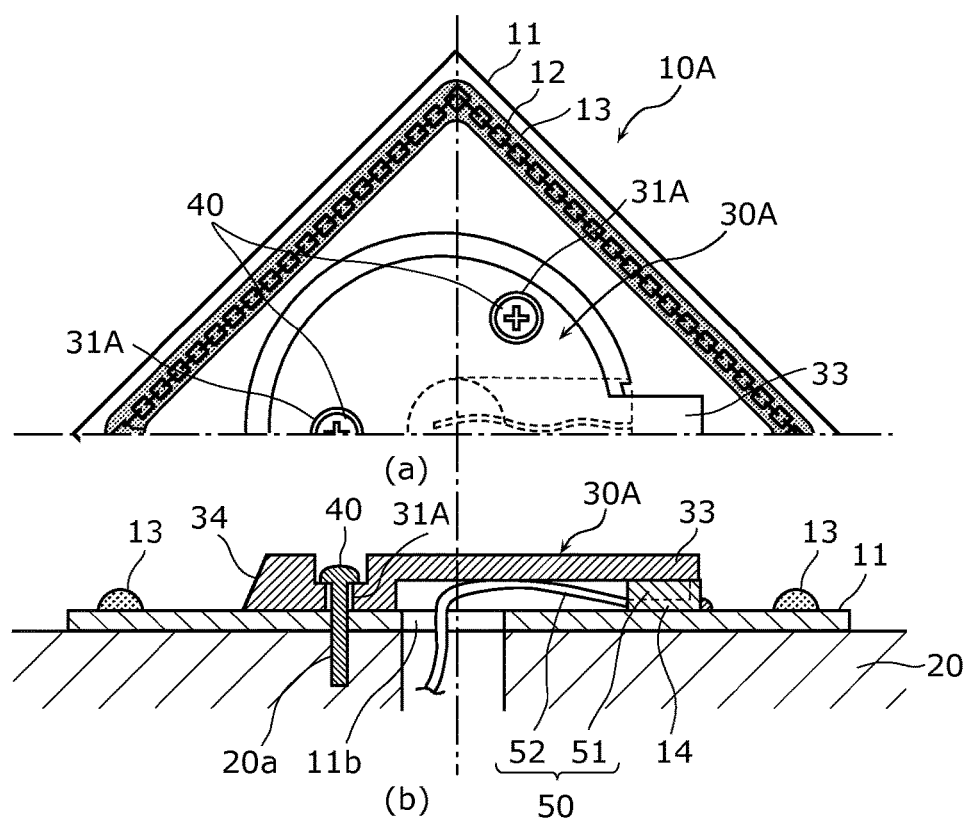
In FIG. 6, (a) is a partial plan view of the vicinity of a light-emitting device in an illumination light source according to Embodiment 2 of the present invention, and (b) is a cross sectional view of the vicinity of the light-emitting device in the same illumination light source, taken along line A-A' in (a) in FIG. 5.

As illustrated in FIG. 5 and (a) in FIG. 6, the location of the second through-hole 11b of the mounting substrate 11 in the light-emitting device 10A according to Embodiment 2 is different from the light-emitting device 10 according to Embodiment 1; in Embodiment 2, the second through-hole 11b is located in the central portion of the mounting substrate 11. With this, the lead 50 is pulled up from below the central portion of the mounting substrate 11 and connected to the power supply part 14, as illustrated in (b) in FIG. 6.

Note that unlike Embodiment 1, the light-emitting device 10A according to Embodiment 2 does not include the protective elements 18 and the sealing member 13 that covers the protective elements 18, but the protective elements 18 and the sealing member 13 that covers the protective elements 18 may be provided.

Moreover, unlike the plate-shaped cover 30 according to Embodiment 1, the cover 30A according to Embodiment 2 has a shape that projects upward, and as illustrated in FIG. 5, the outer surface of the cover 30A forms the shape of a truncated cone. Consequently, the outer side surface 34 of the frame section (side wall) of the cover 30A is a sloping surface. The height of the cover 30A is greater than the height of the sealing member 13.

The cover 30A can be made from, for example, a resin material having electrically insulating properties, such as PBT. Moreover, in order to increase diffusion and reflectivity, the surface of the cover 30A is preferably white.

Similar to the first through-holes 31 according to Embodiment 1, the cover 30A includes three first through-holes 31A. Thus, similar to Embodiment 1, the fasteners 40 pass through the first through-holes 31A, and the first through-holes 31A engage with and hold the fasteners 40. Note that the cover 30A according to Embodiment 2 does not include a structure equivalent to the second through-hole 32 according to Embodiment 1.

The cover 30A also includes a holding part 33 formed so as to protrude outward relative to the frame section. The holding part 33 holds down the connector 51 of the lead 50 connected to the power supply part 14.

As illustrated in (b) in FIG. 6, with this cover 30A, the holding part 33 holds down the connector 51 and the opening defined by the frame section is disposed on the mounting substrate 11 so as to be in surface contact with the main surface of the mounting substrate 11.

Moreover, in Embodiment 2, the second through-hole 11b of the mounting substrate 11 is covered by the cover 30A such that the second through-hole 11b is not visible from the outside.

Note that the height of the cover 30A according to Embodiment 2 is greater than the thickness of the cover 30 according to Embodiment 1. As a result, the length of the fastener 40 according to Embodiment 2 is greater than the length of the fastener 40 according to Embodiment 1. More specifically, a screw having a longer shaft is used.

The illumination light source according to Embodiment 2 achieves the same advantageous effects as Embodiment 1. For example, in Embodiment 2 as well, the mounting substrate 11 of the light-emitting device 10A is fastened and fixed to the pedestal 20 by the fasteners 40 via the cover 30A. Moreover, in Embodiment 2 as well, the LEDs 12 are mounted so as to surround the cover 30A, and the cover 30A is mounted in the region interior to the annularly arranged LEDs 12. With this, similar to Embodiment 1, degradation of light distribution characteristics can be inhibited, and warping, cracking, and splitting of the mounting substrate 11 can be inhibited.

Moreover, in Embodiment 2, the opening defined by the tubular frame section of the cover 30A is in surface contact with the main surface of the mounting substrate 11. With this configuration, since a large area of the main surface of the mounting substrate 11 can be covered by the cover 30A, the cover 30A can be provided up to the peripheral edge portion of the mounting substrate 11. As a result, the area of the mounting substrate 11 up to the peripheral edge portion can be held down by the cover 30, making it possible to further inhibit the outer peripheral edge of the mounting substrate 11 from warping.

Moreover, in Embodiment 2, the outer side surface 34 of the frame section of the cover 30A is a sloping surface, and the area of the opening defined by the frame section decreases with distance from the mounting substrate 11. With this, the light emitting from the light-emitting part (LEDs 12, sealing member 13), toward the inner region interior to the light-emitting part can be reflected upward by the outer side surface 34 of the cover 30A. This increases the light use efficiency.

Moreover, in Embodiment 2, the second through-hole 11b of the mounting substrate 11 is covered by the cover 30A such that the second through-hole 11b is not visible from the outside. With this, since the lead 50, which casts a shadow by blocking part of the light from the light-emitting part, is not exposed, an even luminance distribution can be achieved. Note that by covering other mounted components with the cover 30A, the covered mounted components can be inhibited from absorbing light.

Moreover, in Embodiment 2, the connector 51 of the lead 50 is held down by the holding part 33 of the cover 30A. With this, as illustrated in (b) in FIG. 6, after the lead 50 is routed through the second through-hole 11b is connected to the power supply part 14, even if the resilience of the bent lead 50 were to apply a stress load to the connection portion of the power supply part 14 and the lead 50, the power supply part 14 can be inhibited from separating from the mounting substrate 11 and the lead 50 can be inhibited from separating from the power supply part 14 since a pressing force is applied to the connector 51 by the holding part 33 of the screwed down cover 30A.

Moreover, in Embodiment 2, at least part of the top section of the cover 30A is preferably located on an outer side of each first through-hole 31A. With this, since part of the cover 30A is present on an outer side of each first through-hole 31A, the cover 30A can cover a wide area of the main surface of the mounting substrate 11 in the inner region interior to the annular sealing member 13. With this, in Embodiment 2, since the light-emitting part (LEDs 12, sealing member 13) is formed along the peripheral portion of the mounting substrate 11, it is possible to enlarge the cover 30A to a size that reaches the peripheral portion of the mounting substrate 11. As a result, the area of the mounting substrate 11 up to the peripheral portion can be held down by the cover 30A, making it possible to further inhibit the mounting substrate 11 from warping. More specifically, by forming the skirt of the frame section of the cover 30A to expand (i.e., such that the area of the opening increases), the cover 30A can cover a wider area of the main surface of the mounting substrate 11.

Note that structures and configurations that are the same as in Embodiment 1 also achieve the same advantageous effects as Embodiment 1.

Figure 7:
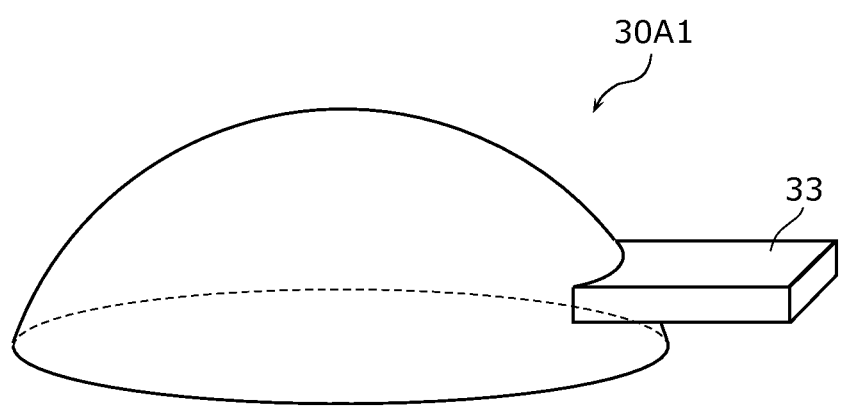
FIG. 7 illustrates a variation of a cover according to Embodiment 2 of the present invention.
Figure 8:
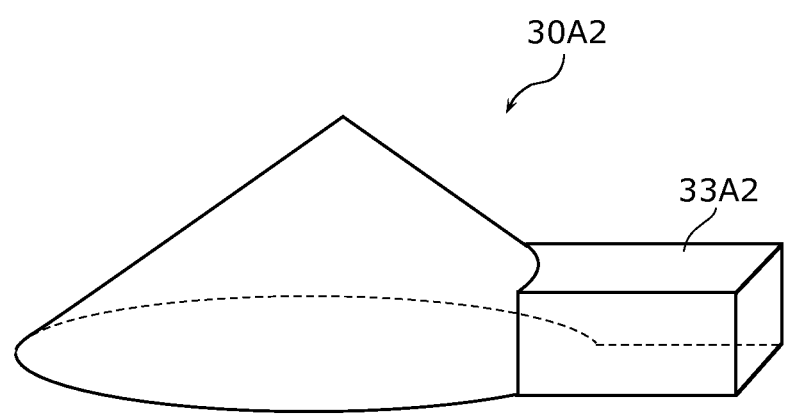
FIG. 8 illustrates another variation of a cover according to Embodiment 2 of the present invention.

Note that in Embodiment 2, the cover 30A has the shape of a truncated cone, but the shape of the cover 30A is not limited to this example. For example, as illustrated in FIG. 7, a cover 30A1 having a semispherical outer surface may be used. Moreover, as illustrated in FIG. 8, a cover 30A2 having a conical outer surface may be used. Furthermore, as illustrated in FIG. 8, instead of the holding part which holds down the connector 51 of the lead 50, the cover may include a hollow cover part 33A2 that completely covers the connector 51 and the power supply part 14. Note that both configurations illustrated in FIG. 7 and FIG. 8 can also be applied to other embodiment and other variations.

(Variation of Embodiment 2)

Figure 9A:
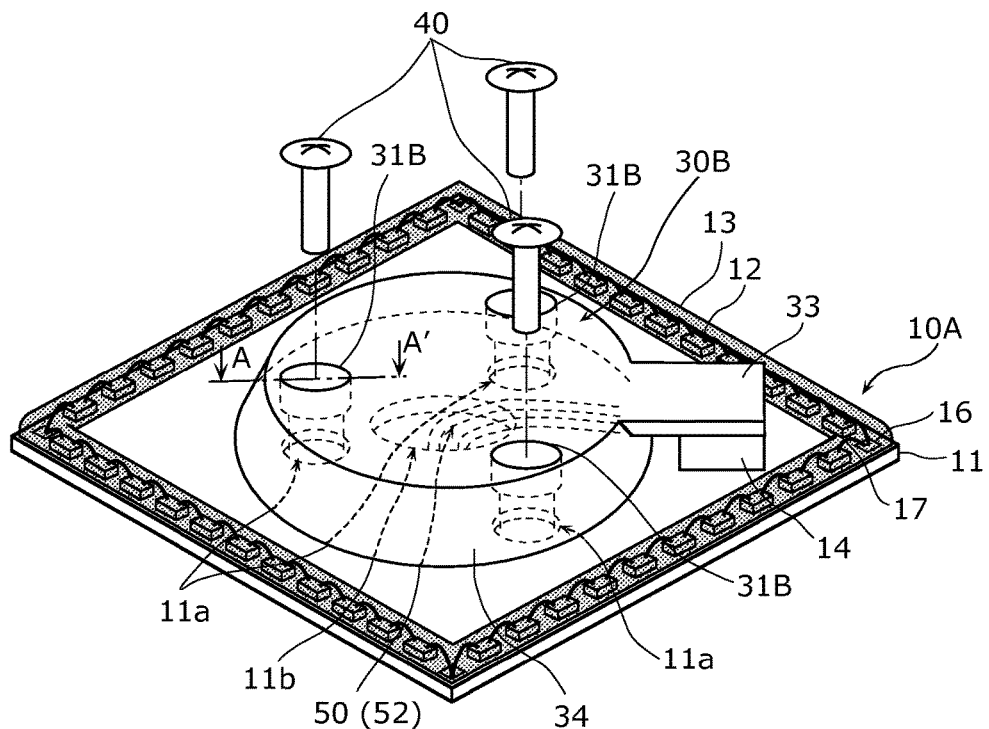
FIG. 9A is a perspective view of the vicinity of a light-emitting device in an illumination light source according to a variation of Embodiment 2 of the present invention.
Figure 9B:
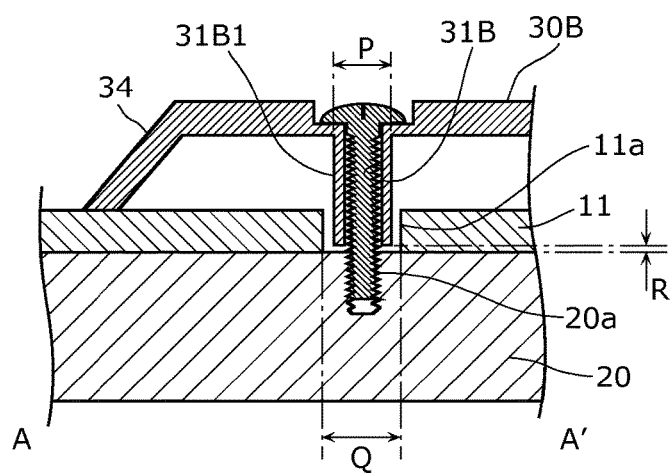
FIG. 9B is a cross sectional view of the vicinity of a first through-hole according to a variation of Embodiment 2 of the present invention (a cross sectional view taken along line A-A' in FIG. 9A).

Next, the vicinity of the light-emitting device in the illumination light source according to a variation of Embodiment 2 of the present invention will be described with reference to FIG. 9A and FIG. 9B. FIG. 9A is a perspective view of the vicinity of the light-emitting device in the illumination light source according to a variation of Embodiment 2 of the present invention. FIG. 9B is a cross sectional view taken along line A-A' in FIG. 9A.

As illustrated in FIG. 9A and FIG. 9B, the outer surface of the cover 30B according to this variation has the same shape as the outer surface of the cover 30A described above, but the shape of the inner surface of the cover 30B differs from the shape of the inner surface of the cover 30A.

More specifically, the overall shape of the cover 30B is a closed-bottom tubular shape including a top section and a frame section which has a tubular shape defining an opening, such that the cover 30B has a cap-like shape with a substantially constant thickness. The outer surface of the cover 30B forms the shape of a truncated cone, and the area of the opening defined by the frame section decreases with distance from the mounting substrate 11. The bottom surface of the tubular frame section of the cover 30B (the portion in contact with the mounting substrate 11) has a circular annular shape. Moreover, the shape of the frame section of the cover 30B in a plan view (the shape of the opening) is approximately circular.

Similar to Embodiment 2, the outer side surface 34 of the frame section of the cover 30B is a sloping surface. Moreover, the height of the cover 30B is greater than the height of the sealing member 13. Furthermore, the cover 30B covers the second through-hole 11b of the mounting substrate 11 such that the second through-hole 11b is not visible from the outside.

Moreover, similar to the first through-holes 31A according to Embodiment 2, the cover 30B includes three first through-holes 31B. Thus, similar to Embodiment 2, the fasteners 40 pass through the first through-holes 31B, and the first through-holes 31B engage with and hold the fasteners 40.

The illumination light source according to this variation achieves the same advantageous effects as Embodiment 2. For example, in this variation as well, the mounting substrate 11 of the light-emitting device 10A is fastened and fixed to the pedestal 20 via the cover 30B by the fasteners 40. Moreover, in this variation as well, the LEDs 12 are mounted so as to surround the cover 30B, and the cover 30B is mounted in the region interior to the annularly arranged LEDs 12. With this, similar to Embodiment 2, degradation of light distribution characteristics can be inhibited, and warping, cracking, and splitting of the mounting substrate 11 can be inhibited. Note that structures and configurations that are the same as in Embodiment 2 also achieve the same advantageous effects as Embodiment 2.

Furthermore, in this variation, unlike the first through-holes 31A according to Embodiment 2, each first through-hole 31B is configured as a tubular cover guide 31B1 through which the shaft of the fastener 40 (screw) passes.

The cover guide 31B1 functions as a guide for positioning the cover 30B relative to the mounting substrate 11. In other words, as illustrated in FIG. 9B, the tip of the cover guide 31B1 on the mounting substrate 11 side is housed in the first through-hole 11a of the mounting substrate 11, and if the cover 30B is to be placed on the mounting substrate 11, the cover 30B is positioned such that the tip of the cover guide 31B1 on the mounting substrate 11 side is positioned inside the first through-hole 11a.

Here, as illustrated in FIG. 9B, when the diameter of the cover guide 31B1 is denoted as P and the diameter of the first through-hole 11a formed in the mounting substrate 11 is denoted as Q, the diameters have a relationship expressed as $Q>P$. In other words, there is a gap between the outer side surface the tip of the cover guide 31B1 on the mounting substrate 11 side and the inner surface of the first through-hole 11a. With this, even if the mounting substrate 11 thermally expands, the mounting substrate 11 can be kept from coming into contact with the cover guide 31B1. As such, the gap is preferably at least a length that can accommodate for the amount of shift resulting from thermal expansion of the mounting substrate 11.

Moreover, in this variation, if the cover guide 31B1 is inserted in the first through-hole 11a and the cover 30B is placed on the mounting substrate 11, a gap having a span R is formed between the bottom surface (lower surface) of the tip of the cover guide 31B1 on the mounting substrate 11 side and the top surface of the pedestal 20. This is configured in this way to take into consideration the load imparted by the fastener 40. In other words, the cover 30B is, for example, screwed down with a screw (the fastener 40) after the cover 30B is placed on the mounting substrate 11, and in this case, by providing the gap described above, the span R of the gap can be reduced to zero ($R=0$) after the cover 30B is screwed down. With this, a desired load can be placed on the entire bottom surface of the frame section of the cover 30B (i.e., the surface in contact with the mounting substrate 11), thus causing the cover 30B to slightly change shape and the mounting substrate 11 to be fixed to the pedestal 20 with pressure.

With this configuration, the clamping force of the screw can be indirectly placed on the mounting substrate 11, and excessive clamping force can be absorbed by the cover 30B. This makes it possible to further inhibit the mounting substrate 11 from cracking or splitting.

Embodiment 3

Figure 10A:
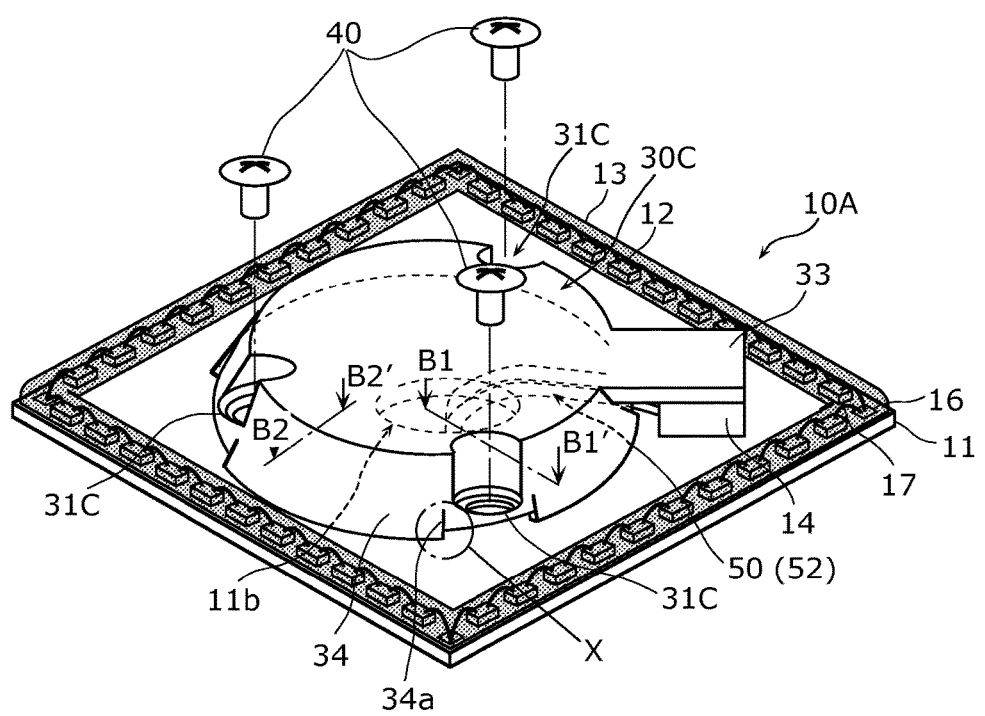
FIG. 10A is a perspective view of the vicinity of a light-emitting device in an illumination light source according to Embodiment 3 of the present invention.
Figure 10B:
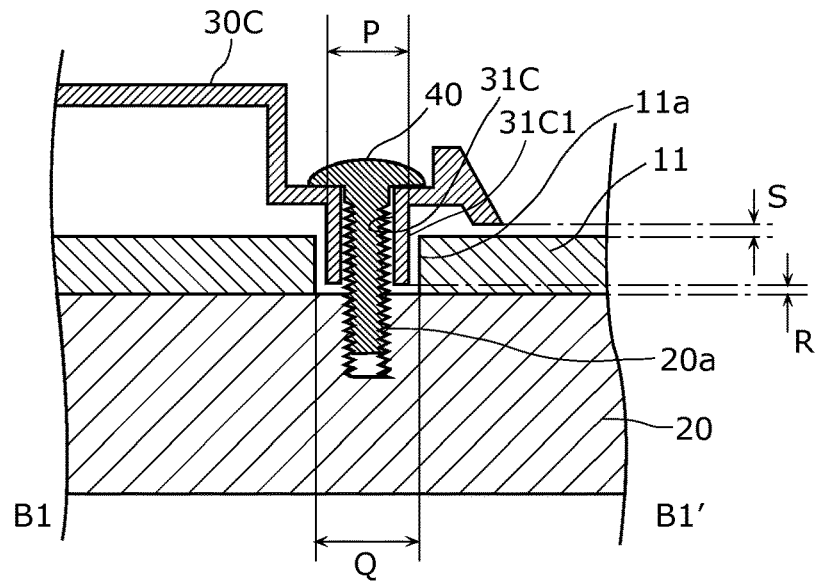
FIG. 10B is a cross sectional view of the vicinity of a first through-hole according to Embodiment 3 of the present invention (a cross sectional view taken along line B1-B1' in FIG. 10A).

Next, the vicinity of the light-emitting device in the illumination light source according to Embodiment 3 of the present invention will be described with reference to FIG. 10A and FIG. 10B. FIG. 10A is a perspective view of the vicinity of the light-emitting device in the illumination light source according to Embodiment 3 of the present invention. FIG. 10B is a cross sectional view taken along line B1-B1' in FIG. 10A.

Note that although the configuration of the entire illumination light source is not illustrated, examples of the illumination light source include an LED lamp such as a bulb-shaped LED lamp (LED bulb) in Embodiment 3 as well.

The illumination light source according to Embodiment 3 differs from the illumination light source according to the variation of Embodiment 2 illustrated in FIG. 9A and FIG. 9B in regard to the configuration of the cover 30C. More specifically, as illustrated in FIG. 10A, the three first through-holes 31C formed in the cover 30C according to Embodiment 3 overlap with the cylindrical frame section. Moreover, in Embodiment 3, when the cover 30C is fastened with screws (the fasteners 40), the position of the screw heads in the first through-holes 31C is lower than the position in the variation of Embodiment 2, as illustrated in FIG. 10B.

Note that similar to the variation of Embodiment 2, the fasteners 40 pass through the first through-holes 31C, and the first through-holes 31C engage with and hold the fasteners 40. Moreover, the three first through-holes 31C are formed at even intervals along the circumferential direction of the frame section.

Moreover, in Embodiment 3, the cover 30C is configured such that part of the frame section of the cover 30C spreads outward when the cover 30C is fastened by the fasteners 40. More specifically, as illustrated in the region X outlined with a dotted and dashed line in FIG. 10A, the region surrounding the first through-hole 31C formed in the cover 30C includes an incision 34a cut from the bottom end of the frame section of the cover 30C upward. The incision 34a is, for example, a cut section (slit) formed in a straight line. The incision 34a is provided as a left and right pair at each first through-hole 31C, with one on either side of the first through-hole 31C.

Before fastening the cover 30C to the pedestal 20, there is gap between the bottom surface of the frame section of the cover 30C in the section between the pair of incisions 34a and the top surface of the mounting substrate 11, and the cover 30C and the mounting substrate 11 are in surface contact in sections other than the section between the pair of incisions 34a. In other words, before fastening the cover 30C to the pedestal 20, the sections of the cover 30C that are in contact with the mounting substrate 11 are projecting sections that project further downward than the surrounding sections of the first through-holes 31C.

The illumination light source according to Embodiment 3 achieves the same advantageous effects as the variation of Embodiment 2. For example, in Embodiment 3 as well, the mounting substrate 11 of the light-emitting device 10A is fastened and fixed to the pedestal 20 by the fastener 40 via the cover 30C. Moreover, in Embodiment 3 as well, the LEDs 12 are mounted so as to surround the cover 30C, and the cover 30C is mounted in the region interior to the annularly arranged LEDs 12. With this, similar to the variation of Embodiment 2, degradation of light distribution characteristics can be inhibited, and warping, cracking, and splitting of the mounting substrate 11 can be inhibited. Note that structures and configurations that are the same as in the variation of Embodiment 2 also achieve the same advantageous effects as the variation of Embodiment 2.

Moreover, in Embodiment 3, the cover 30C is configured such that part of the frame section of the cover 30C spreads outward when the cover 30C is fastened by the fasteners 40. This feature will be explained with reference to FIG. 11.

Figure 11:
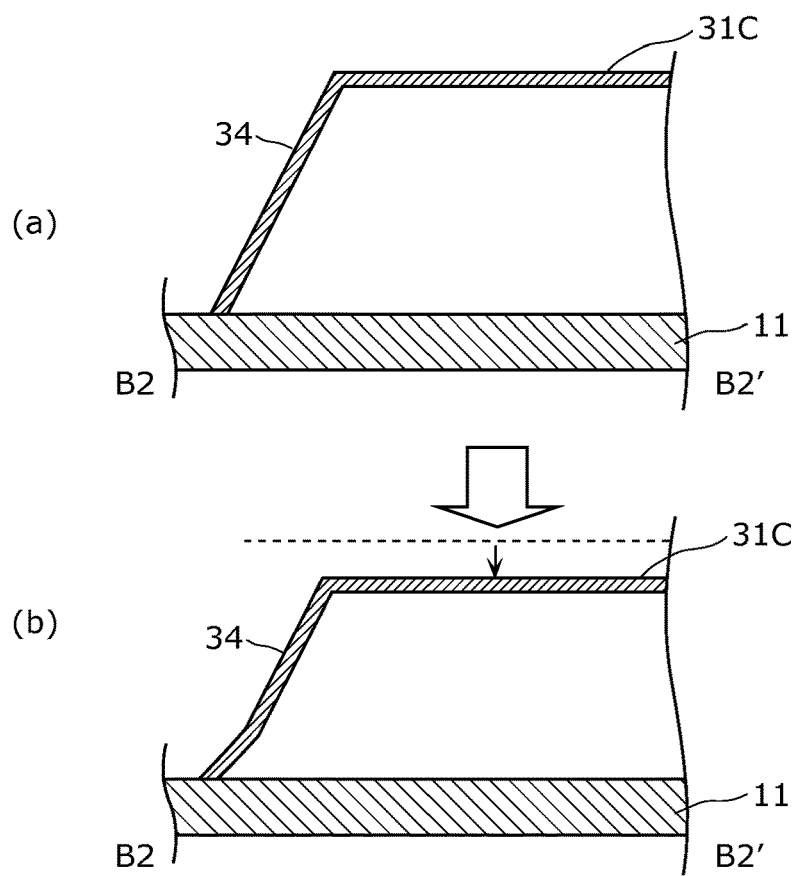
In FIG. 11, (a) and (b) illustrate a function of a cover in an illumination light source according to Embodiment 3 of the present invention.

FIG. 11 is for illustrating a function of the cover in the illumination light source according to Embodiment 3 of the present invention, and, (a) illustrates the cover before being fastened by the fastener (before being screwed down), and (b) illustrates the cover after being fastened by the fastener (after being screwed down). Note that (a) and (b) in FIG. 11 illustrate cross sectional views of the cover (projecting section) and the mounting substrate, taken along line B2-B2' in FIG. 10A.

As illustrated in (a) in FIG. 11, before being fastened by the fastener 40, while the outer side surface 34 of the frame section of the cover 30C is planar and unbent, the bottom surfaces of the projecting sections projecting downward from the frame section of the cover 30C (i.e., the bottom surfaces of sections of the frame section of the cover 30C other than the sections between each pair of incisions 34a) are in contact with the mounting substrate 11.

Although not depicted in the drawings, note that before being fastened by the fasteners 40, the bottom surfaces of sections of the frame section of the cover 30 other than the projecting sections (i.e., the bottom surfaces of the sections between each pair of incisions 34a) are not in contact with the mounting substrate 11 such that a gap is formed therebetween.

Then, in this state, when the fasteners 40 are passed through the cover 30C and fastened and fixed to the pedestal 20, since the frame section of the cover 30 is structured so as to easily change shape as a result of the incisions 34a, the outer side surface 34 at the projecting sections of the frame section of the cover 30C changes shape so as bend outward, as illustrated in (b) in FIG. 11.

With this, after being fastened by the fasteners 40, while the outer side surface 34 at the projecting sections of the frame section of the cover 30C has changed shape so as to bend outward, the bottom surface of the projecting sections of the frame section of the cover 30C is in contact with the mounting substrate 11.

As a result, the cover 30C—mainly the projecting sections projecting downward from the frame section of the cover 30C (i.e., sections of the frame section of the cover 30C other than the sections between each pair of incisions 34a)—presses down on the mounting substrate 11. In contrast, in areas around the first through-holes 31C holding the fasteners 40, sections of the frame section of the cover 30 other than the projecting sections (i.e., the sections between each pair of incisions 34a) do not place a large load on the mounting substrate 11. Since this makes it possible to alleviate concentration of stress by portions fastened by the fastener 40 (the portions around the first through-holes 31C), cracking and splitting of the mounting substrate 11 can be further inhibited.

Moreover, as illustrated in FIG. 10B, the first through-hole 31C according to Embodiment 3 is configured as the cover guide 31C1, similar to first through-hole 31B according to the variation of Embodiment 2 illustrated in FIG. 9B. In Embodiment 3, since the first through-hole 31C overlaps with the frame section of the cover 30C, compared to FIG. 9B, the cover guide 31C1 is shorter in length. Similar to the cover guide 31B1 illustrated in FIG. 9B, the cover guide 31C1 according to Embodiment 3 functions as a guide for positioning the cover 30C relative to the mounting substrate 11.

Here, when the diameter of the opening of the cover guide 31C1 is denoted as P and the diameter of the first through-hole 11a formed in the mounting substrate 11 is denoted as Q, the diameters have a relationship expressed as Q>P in Embodiment 3 as well.

Moreover, when the cover guide 31C1 is inserted in the first through-hole 11a and the cover 30C is placed on the mounting substrate 11, the bottom surfaces projecting sections projecting downward from the frame section of the cover 30C (i.e., the bottom surfaces of sections of the frame section of the cover 30C other than the sections between each pair of incisions 34a) are in contact with the mounting substrate 11, a gap having a span R is provided between (i) the bottom surfaces (lower surfaces) of the end portions on the mounting substrate 11 side of the cover guide 31C1 and (ii) the front surface of the pedestal 20, and a gap having a span S is provided between (i) the bottom surfaces of sections of the frame section of the cover 30 other than the projecting (i.e., the bottom surfaces of the sections between each pair of incisions 34a) and (ii) the mounting substrate 11.

This is configured in this way to take into consideration the load imparted by the fasteners 40, similar to the variation of Embodiment 2. In other words, the cover 30C is, for example, screwed down with screws (the fasteners 40) after the cover 30C is placed on the mounting substrate 11, and in this case, by providing the gap with the span R described above, the span R of the gap can be reduced to zero (R=0) after the cover 30C is screwed down. With this, a desired load can be placed on the entire bottom surface of the frame section of the cover 30C (i.e., the surface in contact with the mounting substrate 11), thus causing the cover 30C to slightly change shape and the mounting substrate 11 to be fixed to the pedestal 20 with pressure.

With this configuration, the clamping force of the screws can be indirectly placed on the mounting substrate 11, and excessive clamping force can be absorbed by the cover 30C. This makes it possible to further inhibit the mounting substrate 11 from cracking or splitting.

Note that when S>R after the cover 30C is fastened by the fasteners 40, a load is also placed on the bottom surfaces of sections of the frame section of the cover 30 other than the projecting sections (i.e., the bottom surfaces of the sections between each pair of incisions 34a). However, when S≥R, in Embodiment 3, a slight gap remains between the mounting substrate 11 and the bottom surfaces of sections of the frame section of the cover 30 other than the projecting sections. In either case, actually fixing the mounting substrate 11 is not a problem, but when S≥R, light from the light-emitting part creeps into the gap that remains, leading to a loss of light. Consequently, the relationship S=R is preferable.

Note that in Embodiment 3, the incisions 34a correspond to the first through-holes 31C, but this example is not limiting. Moreover, increasing the number of incisions 34a makes it easier for the frame section of the cover 30 to change shape.

Moreover, in Embodiment 3, each incision 34a is cut in a straight line, but so long as the projecting sections projecting downward from the frame section of the cover 30C desirably change shape when the cover 30C is fastened by the fasteners 40, the shape of the incision is not limited to this example. Furthermore, if the projecting sections projecting downward from the frame section of the cover 30C desirably change shape when the cover 30C is fastened by the fastener 40 without the incisions 34a, the incisions 34a may be omitted all together.

Embodiment 4

Next, the vicinity of the light-emitting device in the illumination light source according to Embodiment 4 of the present invention will be described with reference to FIG. 12 and FIG. 13.

Figure 12:
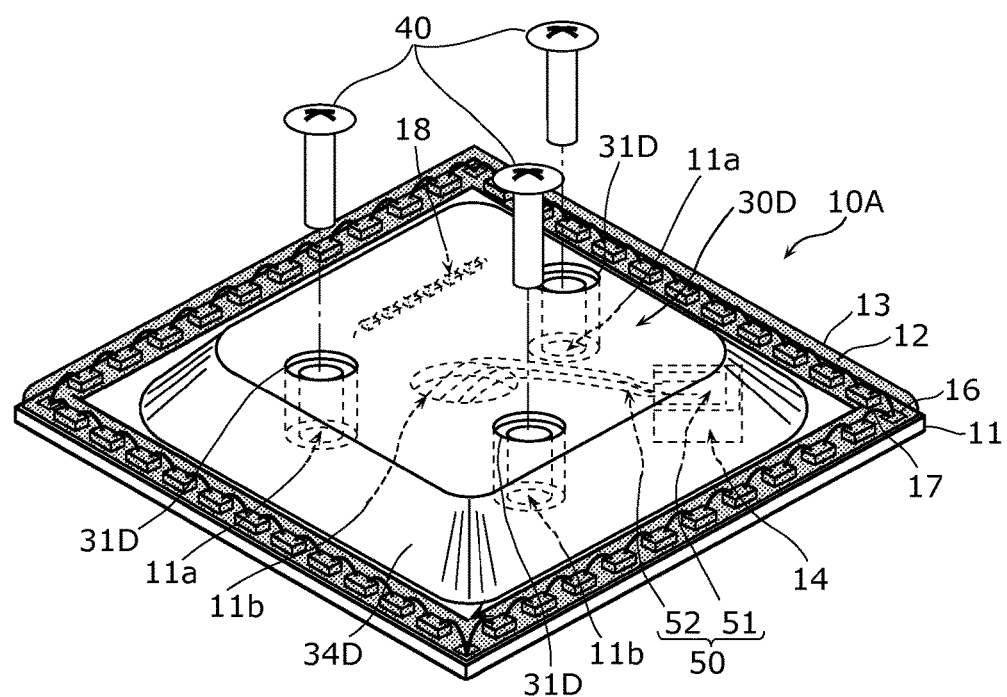
FIG. 12 is a perspective view of the vicinity of a light-emitting device in an illumination light source according to Embodiment 4 of the present invention.

FIG. 12 is a perspective view of the vicinity of the light-emitting device in the illumination light source according to Embodiment 4 of the present invention. FIG. 13 is a plan view of the vicinity of the light-emitting device in the same illumination light source. Note that although the configuration of the entire illumination light source is not illustrated, examples of the illumination light source include an LED lamp such as a bulb-shaped LED lamp (LED bulb) in Embodiment 4 as well.

The illumination light source according to Embodiment 4 differs from the illumination light source according to Embodiment 2 in regard to the configuration of the cover 30D.

Figure 13:
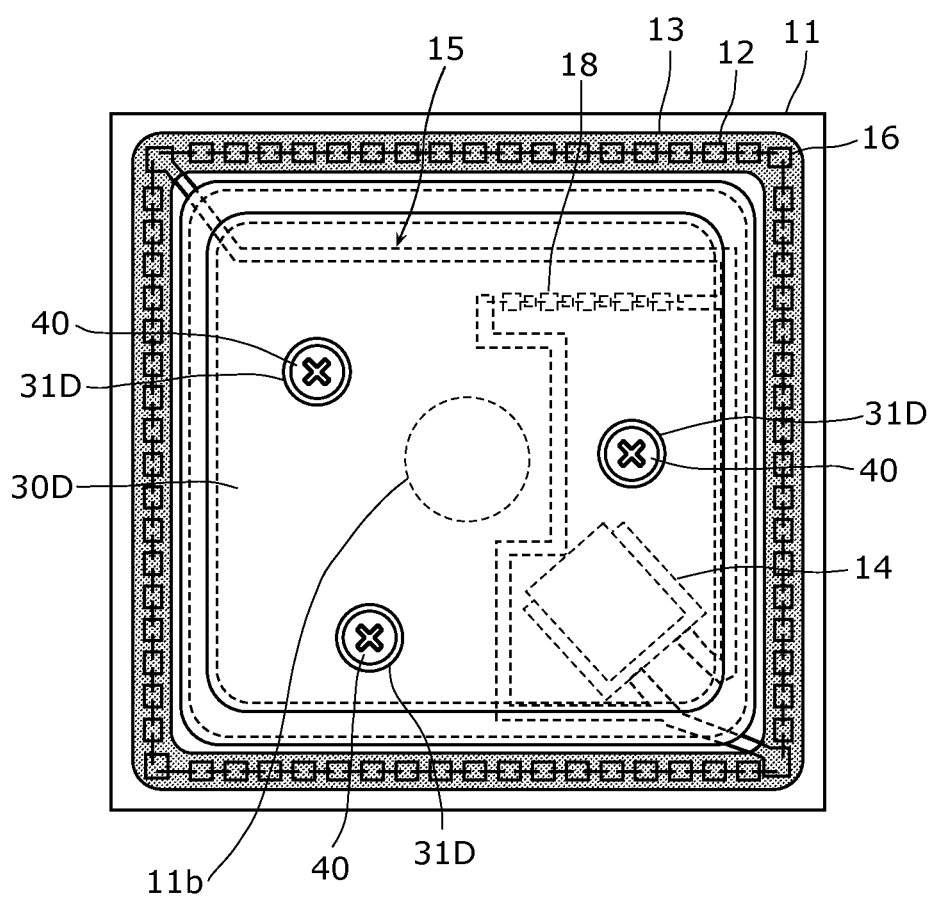
FIG. 13 is a plan view of the vicinity of a light-emitting device in an illumination light source according to Embodiment 4 of the present invention.

As illustrated in FIG. 12 and FIG. 13, similar to the cover 30A according to Embodiment 2, the cover 30D according to Embodiment 4 has a shape that projects upward, but the shape of the inner surface differs from that of the cover 30A according to Embodiment 2.

More specifically, the overall shape of the cover 30D is a closed-bottom tubular shape including a top section and a frame section which has an angular tubular shape defining an opening, such that the cover 30D has a cap-like shape with a substantially constant thickness. The outer surface of the cover 30D forms the shape of an angular truncated cone, and the area of the opening defined by the frame section decreases with distance from the mounting substrate 11. The bottom surface of the tubular frame section of the cover 30D (i.e., the surface in contact with the mounting substrate 11) has a rectangular shape, and in Embodiment 4, has a square shape.

Similar to Embodiment 2, the outer side surface 34 of the frame section of the cover 30D is a sloping surface. Moreover, the height of the cover 30D is greater than the height of the sealing member 13.

The cover 30D covers the second through-hole 11b of the mounting substrate 11 such that the second through-hole 11b is not visible from the outside. Moreover, the cover 30D covers the power supply part 14 and the protective elements 18.

Furthermore, the cover 30D according to Embodiment 4 is disposed such that the edge of the opening defined by the frame section is located near the light-emitting part, in the region interior to the light-emitting part (LEDs 12, sealing member 13). In other words, as illustrated in FIG. 13, the shape of the opening defined by the frame section of the cover 30D and the annular shape of the light-emitting part have approximately the same shape (square shape in Embodiment 4), and a slight gap is present between the light-emitting part and the edge of the opening defined by the frame section of the cover 30D on the light-emitting part side. With this, the cover 30D can cover almost the entire section of the mounting substrate 11 interior to the light-emitting part (LEDs 12, sealing member 13).

Similar to Embodiment 2, the cover 30D can be made from, for example, a resin material having electrically insulating properties, such as PBT. Moreover, in order to increase diffusion and reflectivity, the surface of the cover 30D is preferably white.

Moreover, similar to the first through-holes 31A according to Embodiment 2, the cover 30D includes three first through-holes 31D. Thus, similar to Embodiment 2, the fasteners 40 pass through the first through-holes 31D, and the first through-holes 31D engage with and hold the fasteners 40.

The illumination light source according to Embodiment 4 achieves the same advantageous effects as Embodiment 2. For example, in Embodiment 4 as well, the mounting substrate 11 of the light-emitting device 10A is fastened and fixed to the pedestal 20 via the cover 30D by the fasteners 40. Moreover, in Embodiment 4 as well, the LEDs 12 are mounted so as to surround the cover 30D, and the cover 30D is mounted in the region interior to the annularly arranged LEDs 12. With this, similar to Embodiment 2, degradation of light distribution characteristics can be inhibited, and warping, cracking, and splitting of the mounting substrate 11 can be inhibited. Note that structures and configurations that are the same as in Embodiment 2 also achieve the same advantageous effects as Embodiment 2.

Furthermore, in Embodiment 4, the cover 30D covers almost the entire region interior to the light-emitting part (LEDs 12, sealing member 13). With this, electrically conductive components disposed in the region interior to the light-emitting part are housed under the cover 30D. Examples of the electrically conductive components include the power supply part 14, the line 15, the protective elements 18, and the lead 50, and since these electrically conductive components are covered by the cover 30D, they are not visible from the outside. Consequently, arranging the electrically conductive components in the inner region interior to the light-emitting part inhibits reflection and absorption of light emitted from the light-emitting part, and as a result, reduction in light emission efficiency can be further inhibited and a more even luminance distribution can be achieved.

Furthermore, for electrical insulation, the exposed part of the line 15 can be coated with an electrically insulating film, such as a glass coating, but since almost the entire region interior to the light-emitting part (LEDs 12, sealing member 13) is covered by the cover 30D as in Embodiment 4, such coating is not necessary. Moreover, in Embodiment 1, etc., the protective elements 18 are sealed with the sealing member 13 to protect the protective elements 18 from degradation, but in Embodiment 4, since the protective elements 18 are covered by the cover 30D, sealing the protective elements 18 is not necessary. Thus, since these coating and sealing processes are not required in Embodiment 4, the manufacturing process can be simplified and the materials used can be reduced, thereby cutting costs.

Embodiment 5

Figure 14:
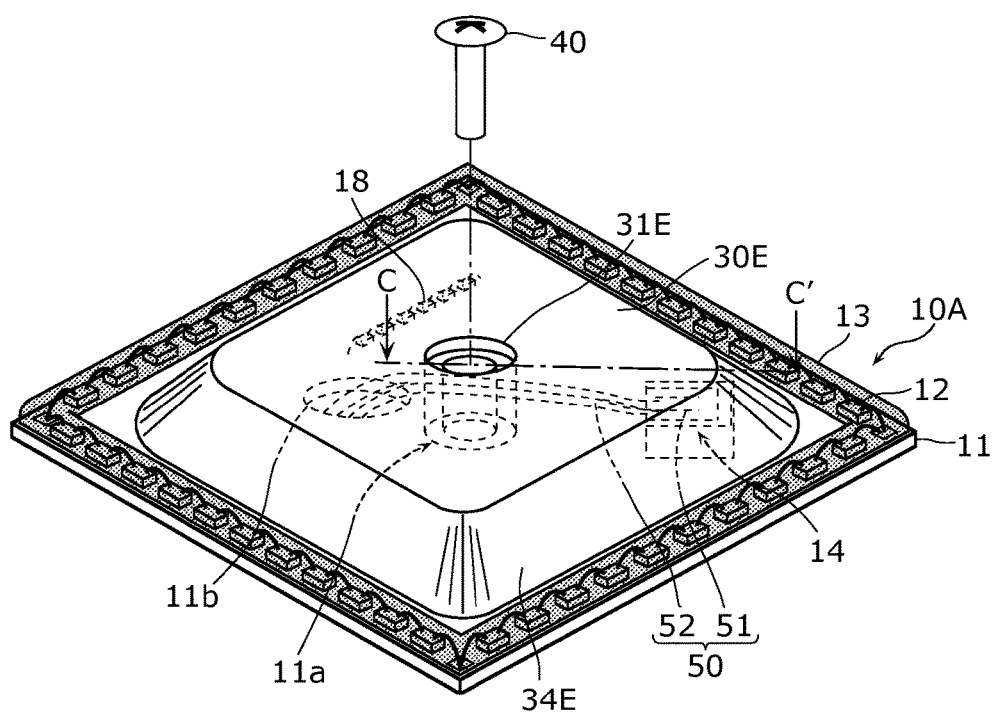
FIG. 14 is a perspective view of the vicinity of a light-emitting device in an illumination light source according to Embodiment 5 of the present invention.
Figure 15A:
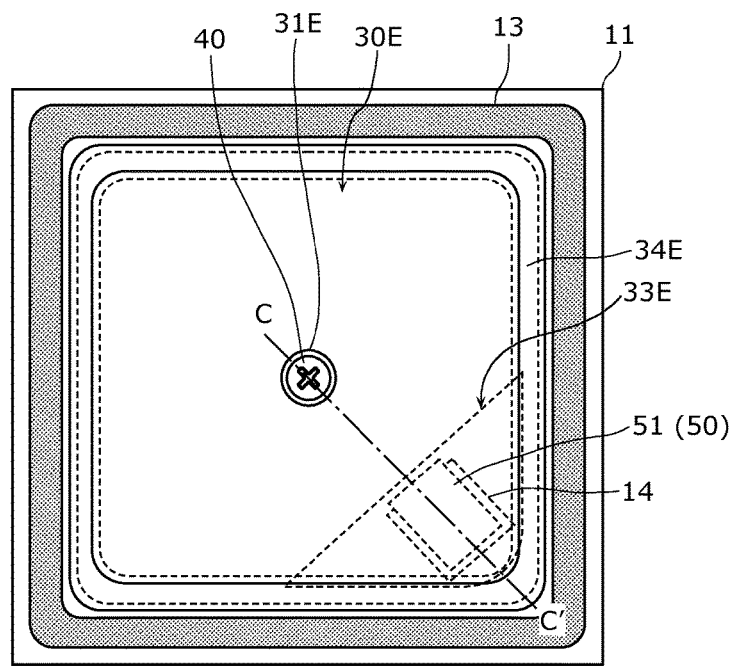
FIG. 15A is a plan view of the vicinity of the same light-emitting device in the illumination light source according to Embodiment 5 of the present invention.
Figure 15B:
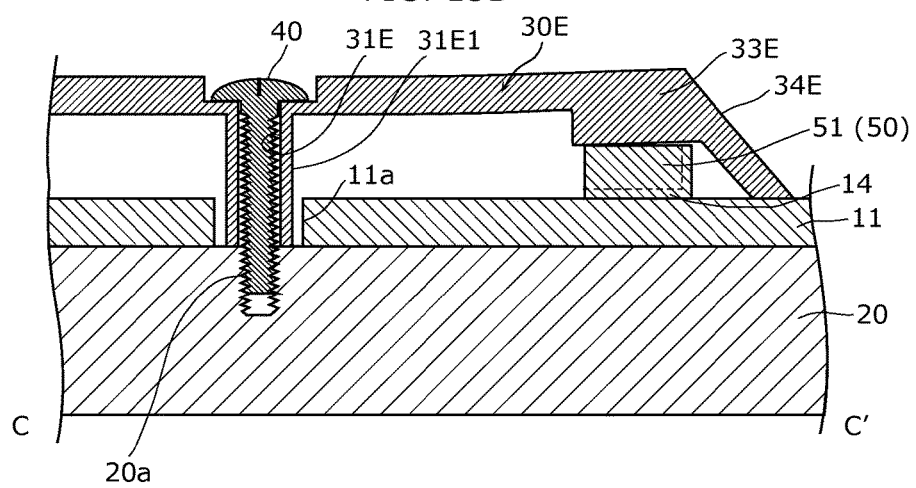
FIG. 15B is a cross sectional view of the vicinity of a first through-hole and a holding part according to Embodiment 5 of the present invention (a cross sectional view taken along line C-C' in FIG. 14 and FIG. 15A).

Next, the vicinity of the light-emitting device in the illumination light source according to Embodiment 5 of the present invention will be described with reference to FIG. 14, FIG. 15A, and FIG. 15B. FIG. 14 is a perspective view of the vicinity of the light-emitting device in the illumination light source according to Embodiment 5 of the present invention. FIG. 15A is a plan view of the vicinity of the same light-emitting device, and FIG. 15B is a cross sectional view taken along line C-C' in FIG. 14 and FIG. 15A.

Note that although the configuration of the entire illumination light source is not illustrated, examples of the illumination light source include an LED lamp such as a bulb-shaped LED lamp (LED bulb) in Embodiment 5 as well.

The illumination light source according to Embodiment 5 differs from the illumination light source according to Embodiment 4 in regard to the configuration of the cover 30E. More specifically, as illustrated in FIG. 14, FIG. 15A, and FIG. 15B, the cover 30E only includes one first through-hole 31E, which is formed in the central portion of the top section. Moreover, in Embodiment 5, the cover 30E includes a holding part 33E on the inside of the frame section.

The fastener 40 passes through the first through-hole 31E, and the first through-hole 31E engages with and holds the fastener 40. Moreover, the first through-hole 31E is configured as the tubular cover guide 31E1, similar to first through-hole 31B according to the variation of Embodiment 2 illustrated in FIG. 9B.

The holding part 33E is in surface contact with the connector 51 of the lead 50 connected to the power supply part 14 to hold down the connector 51, and in Embodiment 5, is disposed in a corner of the angular tubular frame section so as to correspond to the location of the power supply part 14, as illustrated in FIG. 15A and FIG. 15B. Moreover, the holding part 33E is relatively thick, and, for example, is formed by designing a portion of the cover 30E to be thick.

The illumination light source according to Embodiment 5 achieves the same advantageous effects as Embodiment 3. For example, in Embodiment 5 as well, the mounting substrate 11 of the light-emitting device 10A is fastened and fixed to the pedestal 20 via the cover 30E by the fastener 40. Moreover, in Embodiment 5 as well, the LEDs 12 are mounted so as to surround the cover 30E, and the cover 30E is mounted in the region interior to the annularly arranged LEDs 12. With this, similar to Embodiment 3, degradation of light distribution characteristics can be inhibited, and warping, cracking, and splitting of the mounting substrate 11 can be inhibited. Note that structures and configurations that are the same as in Embodiment 3 also achieve the same advantageous effects as Embodiment 3.

Moreover, in Embodiment 5, the connector 51 of the lead 50 is held down by the holding part 33E of the cover 30E. With this, even if the resilience of the bent lead 50 were to apply a stress load to the connection portion of the power supply part 14 and the lead 50, the power supply part 14 can be inhibited from separating from the mounting substrate 11 and the lead 50 can be inhibited from separating from the power supply part 14 since a pressing force is applied to the connector 51 by the holding part 33E of the screwed down cover 30E.

(Variation 1 of Embodiment 5)

Next, the vicinity of the light-emitting device in the illumination light source according to Variation 1 of Embodiment 5 of the present invention will be described with reference to FIG. 16A and FIG. 16B.

Figure 16A:
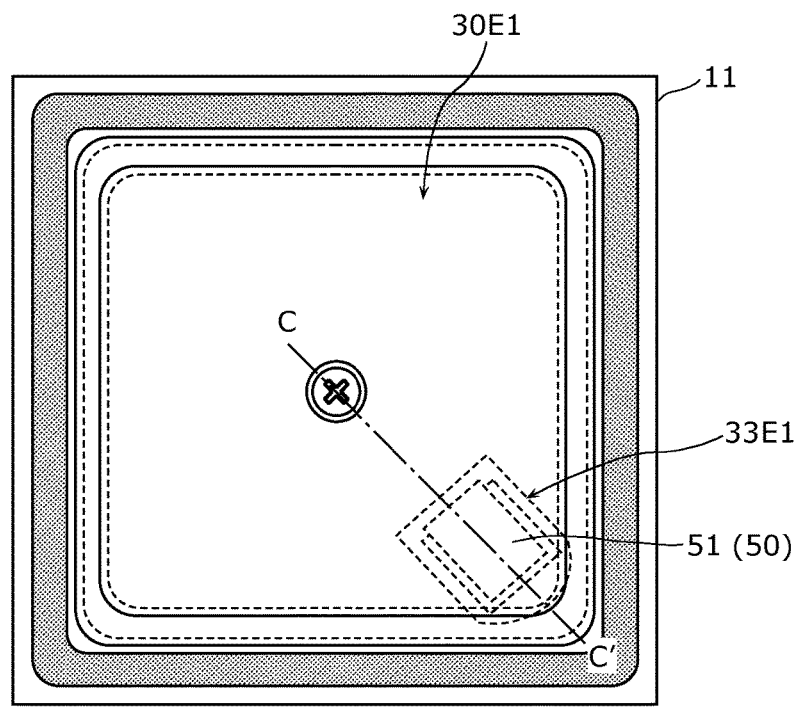
FIG. 16A is a plan view of the vicinity of a light-emitting device in an illumination light source according to Variation 1 of Embodiment 5 of the present invention.
Figure 16B:
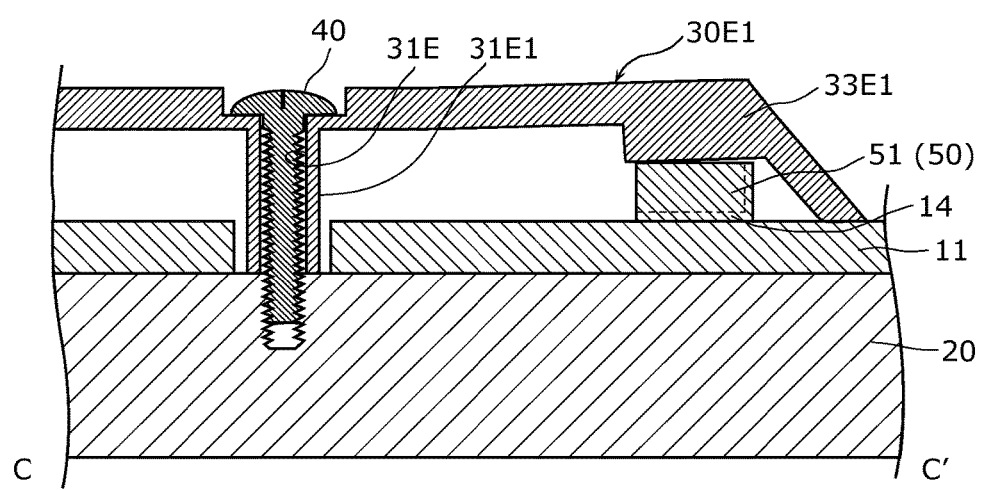
FIG. 16B is a cross sectional view of the vicinity of a first through-hole and a holding part according to Variation 1 of Embodiment 5 of the present invention (a cross sectional view taken along line C-C' in FIG. 16A).

FIG. 16A is a plan view of the vicinity of the light-emitting device in the illumination light source according to Variation 1 of Embodiment 5 of the present invention. FIG. 16B is a cross sectional view taken along line C-C' in FIG. 16A.

The illumination light source according to Variation 1 of Embodiment 5 differs from the illumination light source according to Embodiment 5 illustrated in FIG. 15A and FIG. 15B in regard to the configuration of the holding part 33E1 of the cover 30E1. More specifically, the holding part 33E1 according to Variation 1 of Embodiment 5 is formed only above the connector 51 of the lead 50, as illustrated in FIG. 16A. With this, similar to Embodiment 5, the power supply part 14 can be inhibited from separating from the mounting substrate 11, and the lead 50 can be inhibited from separating from the power supply part 14.

In this way, so long as the holding part 33E1 holds down the connector 51 of the lead 50, the area of the cover 30E1 in which the holding part 33E1 is formed is not particularly limited.

Note that structures and configurations that are the same as in Embodiment 5 also achieve the same advantageous effects as Embodiment 5.

(Variation 2 of Embodiment 5)

Next, the vicinity of the light-emitting device in the illumination light source according to Variation 2 of Embodiment 5 of the present invention will be described with reference to FIG. 17A and FIG. 17B.

Figure 17A:
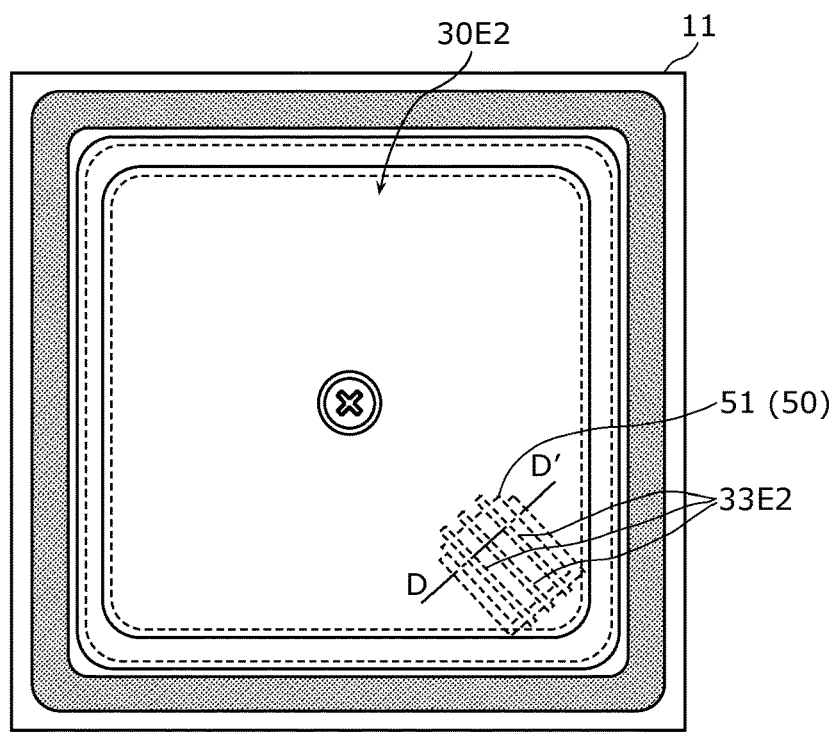
FIG. 17A is a plan view of the vicinity of a light-emitting device in an illumination light source according to Variation 2 of Embodiment 5 of the present invention.
Figure 17B:
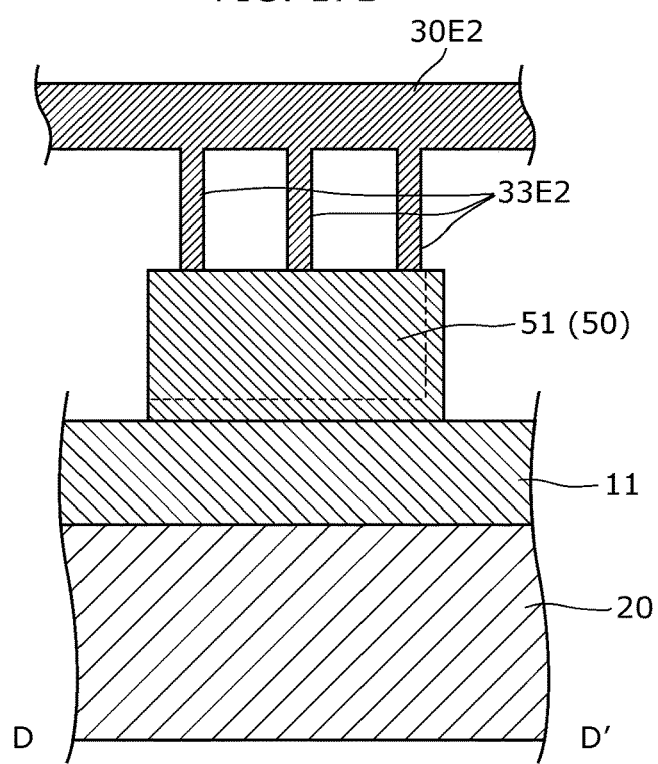
FIG. 17B is a cross sectional view of the vicinity of a first through-hole and a holding part according to Variation 2 of Embodiment 5 of the present invention (a cross sectional view taken along line D-D' in FIG. 17A).

FIG. 17A is a plan view of the vicinity of the light-emitting device in the illumination light source according to Variation 2 of Embodiment 5 of the present invention. FIG. 17B is a cross sectional view taken along line D-D' in FIG. 17A.

The illumination light source according to Variation 2 of Embodiment 5 differs from the illumination light source according to Embodiment 5 illustrated in FIG. 15A and FIG. 15B in regard to the configuration of the holding part 33E2 of the cover 30E2. More specifically, the holding part 33E2 according to Variation 2 of Embodiment 5 is formed as fins, so as to partially press down on the top portion of the connector 51 of the lead 50, as illustrated in FIG. 17A and FIG. 17B. With this, similar to Embodiment 5, the power supply part 14 can be inhibited from separating from the mounting substrate 11, and the lead 50 can be inhibited from separating from the power supply part 14.

In this way, so long as the holding part 33E2 holds down at least part of the connector 51 of the lead 50, the shape of the holding part 33E2 is not particularly limited.

Note that structures and configurations that are the same as in Embodiment 5 also achieve the same advantageous effects as Embodiment 5.

Embodiment 6

Figure 18:
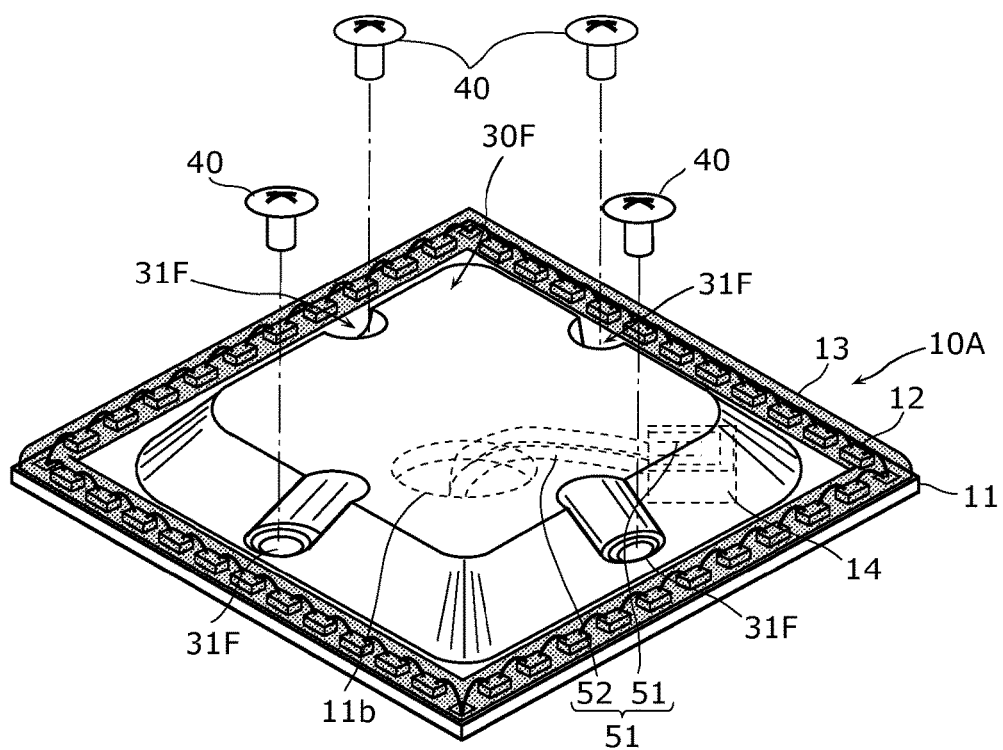
FIG. 18 is a perspective view of the vicinity of a light-emitting device in an illumination light source according to Embodiment 6 of the present invention.

Next, the vicinity of the light-emitting device in the illumination light source according to Embodiment 6 of the present invention will be described with reference to FIG. 18. FIG. 18 is a perspective view of the vicinity of the light-emitting device in the illumination light source according to Embodiment 6 of the present invention.

Note that although the configuration of the entire illumination light source is not illustrated, examples of the illumination light source include an LED lamp such as a bulb-shaped LED lamp (LED bulb) in Embodiment 6 as well.

The illumination light source according to Embodiment 6 differs from the illumination light source according to Embodiment 4 illustrated in FIG. 12 and FIG. 13 in regard to the configuration of the cover 30F. More specifically, as illustrated in FIG. 18, the first through-holes 31F formed in the cover 30F according to Embodiment 5 overlap with the angular cylindrical frame section.

The first through-holes 31F are provided at each side of the frame section of the cover 30F, which has a rectangular shape in a plan view. When the cover 30F is fastened with screws (the fasteners 40), the position of each screw head in the first through-hole 31F is lower than the position in Embodiment 4, as illustrated in FIG. 18. Moreover, similar to Embodiment 4, the fasteners 40 pass through the first through-holes 31F, and the first through-holes 31F engage with and hold the fasteners 40.

The illumination light source according to Embodiment 5 achieves the same advantageous effects as Embodiment 4. For example, in Embodiment 5 as well, the mounting substrate 11 of the light-emitting device 10A is fastened and fixed to the pedestal 20 via the cover 30F by the fasteners 40. Moreover, in Embodiment 5 as well, the LEDs 12 are mounted so as to surround the cover 30F, and the cover 30F is mounted in the region interior to the annularly arranged LEDs 12. With this, similar to Embodiment 4, degradation of light distribution characteristics can be inhibited, and warping, cracking, and splitting of the mounting substrate 11 can be inhibited.

Note that structures and configurations that are the same as in Embodiment 4 also achieve the same advantageous effects as Embodiment 4.

Embodiment 7

Figure 19:
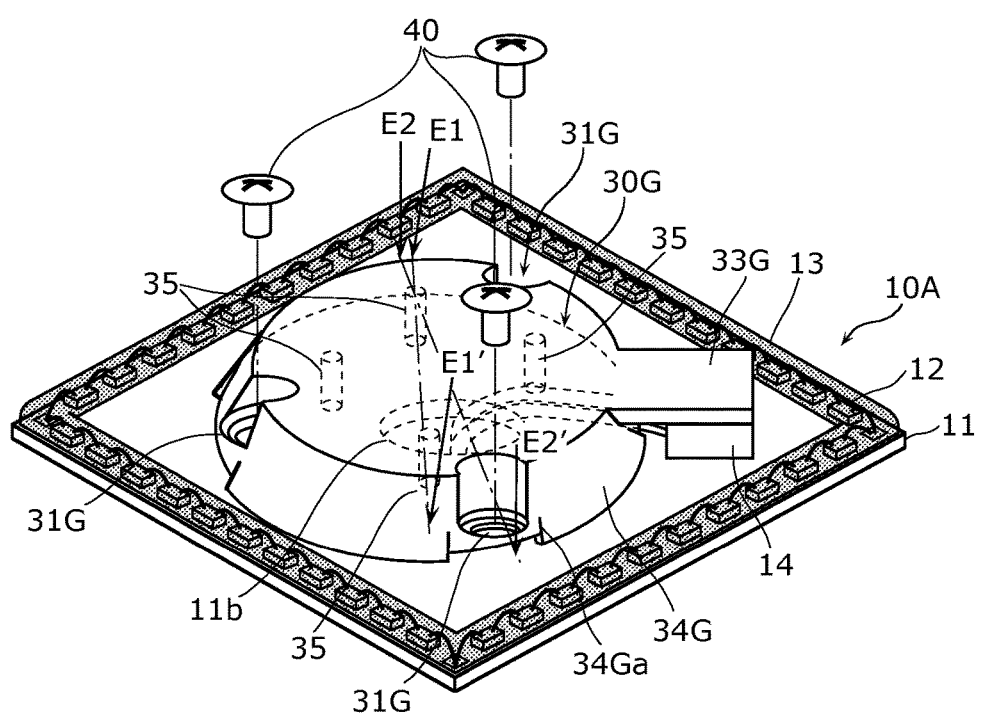
FIG. 19 is a perspective view of the vicinity of a light-emitting device in an illumination light source according to Embodiment 7 of the present invention.
Figure 20A:
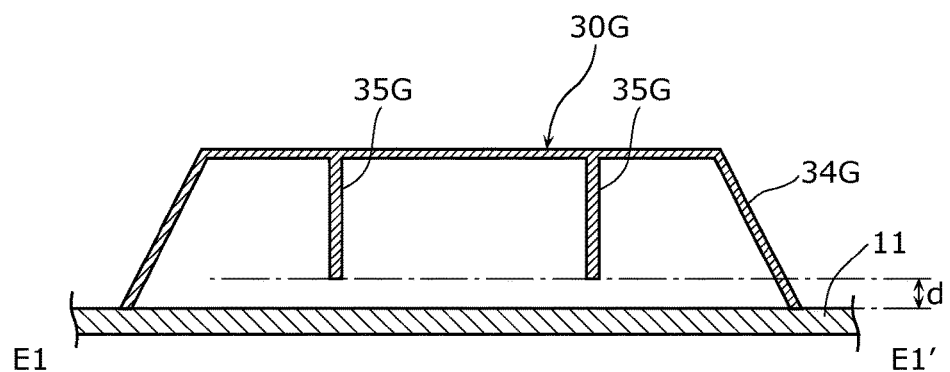
FIG. 20A is a cross sectional view of a cover and a mounting substrate according to Embodiment 7 of the present invention (a cross sectional view taken along line E1-E1' in FIG. 19).
Figure 20B:
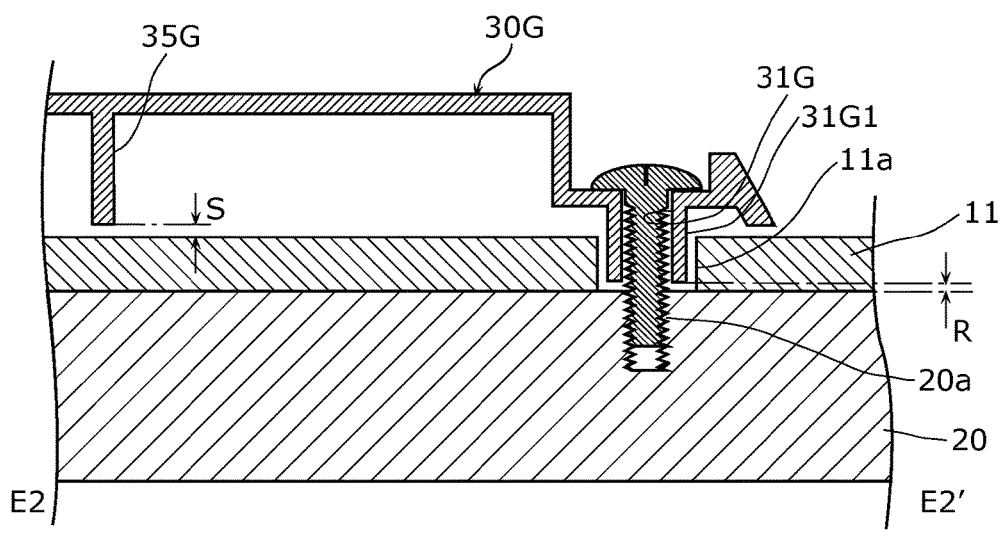
FIG. 20B is a cross sectional view of the vicinity of a first through-hole and a projection according to Embodiment 7 of the present invention (a cross sectional view taken along line E2-E2' in FIG. 19).

Next, the vicinity of the light-emitting device in the illumination light source according to Embodiment 7 of the present invention will be described with reference to FIG. 19, FIG. 20A, and FIG. 20B. FIG. 19 is a perspective view of the vicinity of the light-emitting device in the illumination light source according to Embodiment 7 of the present invention. FIG. 20A is a cross sectional view taken along line E1-E1' in FIG. 19, and FIG. 20B is a cross sectional view taken along line E2-E2' in FIG. 19. Note that the second through-hole 11b formed in the mounting substrate 11 is omitted from FIG. 20A and FIG. 20B.

Note that although the configuration of the entire illumination light source is not illustrated, examples of the illumination light source include an LED lamp such as a bulb-shaped LED lamp (LED bulb) in Embodiment 7 as well.

The illumination light source according to Embodiment 7 differs from the illumination light source according to Embodiment 3 illustrated in FIG. 10A and FIG. 10B in regard to the configuration of the cover 30G. More specifically, the cover 30G according to Embodiment 7 includes a plurality of projections (bosses) 35, as illustrated in FIG. 19, FIG. 20A, and FIG. 20B.

The projections 35 function as stoppers that prevent over tightening of the fasteners 40, and as illustrated FIG. 20A, project from the inner surface of the top section of the cover 30G toward the mounting substrate 11. In Embodiment 7, four approximately cylindrical projections 35 are provided, as illustrated in FIG. 19. Note that the projections 35 can be formed as parts of the cover 30G.

Moreover, the cover 30G according to Embodiment 8 includes three first through-holes 31G and includes incisions 34Ga cut in the outer side surface 34G. The first through-holes 31G and the incisions 34Ga have the same structure as the first through-holes 31C and the incisions 34a according to Embodiment 3.

The illumination light source according to Embodiment 7 achieves the same advantageous effects as Embodiment 3. For example, in Embodiment 7 as well, the mounting substrate 11 of the light-emitting device 10A is fastened and fixed to the pedestal 20 by the fastener 40 via the cover 30G. Moreover, in Embodiment 7 as well, the LEDs 12 are mounted so as to surround the cover 30G, and the cover 30G is mounted in the region interior to the annularly arranged LEDs 12. With this, similar to Embodiment 3, degradation of light distribution characteristics can be inhibited, and warping, cracking, and splitting of the mounting substrate 11 can be inhibited. Note that structures and configurations that are the same as in Embodiment 3 also achieve the same advantageous effects as Embodiment 3.

Moreover, in Embodiment 7, the cover 30G includes the protrusions 35. With this, when fastening and fixing the cover 30G to the pedestal 20 with the fastener s40, even if the fasteners 40 were over tightened, since the distal ends of the projections 35 abut the surface of the mounting substrate 11, further tightening of the fasteners 40 is prevented. With this, cracking and splitting of the mounting substrate 11 as a result of over tightening of the fasteners 40 can be inhibited.

As illustrated in FIG. 20B, when the span between the surface of the pedestal 20 and the bottom surface (lower surface) of the mounting substrate 11 side end of the cover guide 31G1 is denoted as R, and the span between the mounting substrate 11 and the bottom surface (lower surface) of the distal ends of the projections 35 of the cover 30G is denoted as S, it is preferable that span S be equal to span R (S=R), or that span S be slightly less than span R (S<R).

When S=R, the projections 35 do not place a load on the mounting substrate 11, so the cover 30G and the mounting substrate 11 can be kept from, for example, changing shape. Moreover, when S and R vary slightly and S<R, a suitable load can be placed on the mounting substrate 11, so the projections 35 can push down on the mounting substrate 11. This makes it possible to further distribute the load placed on the mounting substrate 11 by the cover 30G, and fix the mounting substrate 11 in place with pressure.

Embodiment 8

Figure 21A:
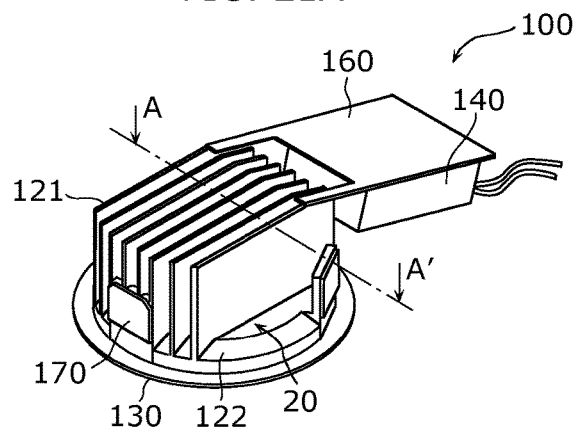
FIG. 21A is an external perspective view of an illumination device according to Embodiment 8 of the present invention.
Figure 21B:
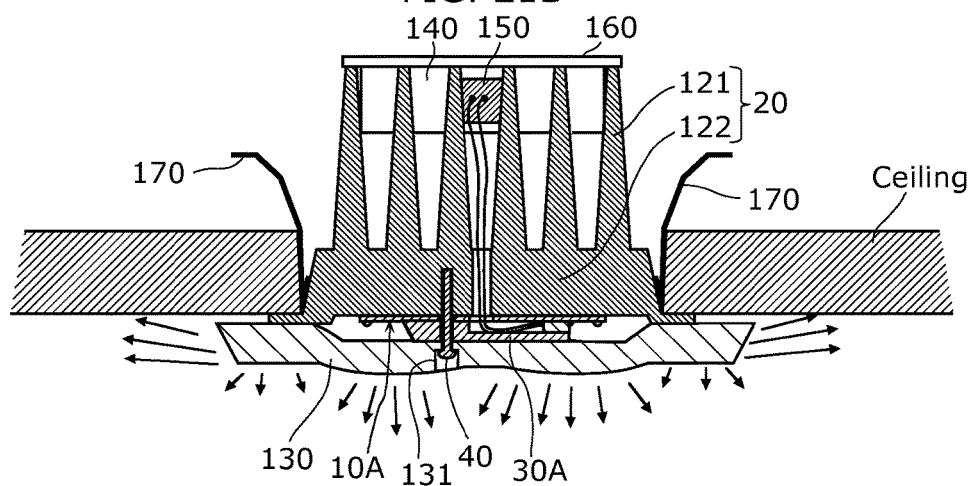
FIG. 21B is cross sectional view of an illumination device according to Embodiment 8 of the present invention, taken along line A-A' in FIG. 21A.

Next, the illumination device 100 according to Embodiment 8 of the present invention will be described with reference to FIG. 21A and FIG. 21B. FIG. 21A is an external perspective view of the illumination device according to Embodiment 8 of the present invention. FIG. 21B is cross sectional view of the illumination device according to Embodiment 8 of the present invention, taken along line A-A' in FIG. 21A.

As illustrated in FIG. 21A and FIG. 21B, the illumination device 100 according to Embodiment 8 is a sunken illumination device, such as a recessed light, that emits light downward (toward the floor or a wall, for example) by being installed, for example, in the ceiling of a house, and includes the light-emitting device 10A according to Embodiment 2, the pedestal 20, the cover 30A, and the fastener 40 illustrated in FIG. 5 and FIG. 6.

The illumination device 100 further includes a lens 130, a power source device 140, a terminal base 150, an attachment plate 160, and a fixing spring 170.

The pedestal 20 according to Embodiment 8 is the main body of the illumination device, an attachment base for attaching the light-emitting device 10, and a heat sink for dissipating heat generated by the light-emitting device 10A. The pedestal 20 can be formed from a metal material, and can be, for example, an aluminum die cast.

A plurality of heat dissipating fins 121 that project upward are disposed on the top portion of the pedestal 20 main body 120 (i.e., the portion on the side that is inserted in the ceiling). With this, the heat generated by the light-emitting device 10A can be effectively dissipated.

Moreover, the pedestal 20 includes an attachment part 122 for attaching and fixing the light-emitting device 10A. The light-emitting device 10A is placed on the surface of the attachment part 122. A screw hole 122a is formed in the attachment part 122 and, similar to Embodiment 1, the light-emitting device 10A is fastened and fixed to the attachment part 122 via the cover 30A with the fastener 40 (screw). The screw hole 122a corresponds to the fixing hole 20a in Embodiment 1.

The lens 130 is a light-transmissive component, and can be made from an electrically-insulating transparent material, such as a resin material like PMMA (acrylic resin) or polycarbonate, or a glass material. The lens 130 is disposed on the light-emitting side of the light-emitting device 10A so as to cover the light-emitting device 10A.

Figure 22:
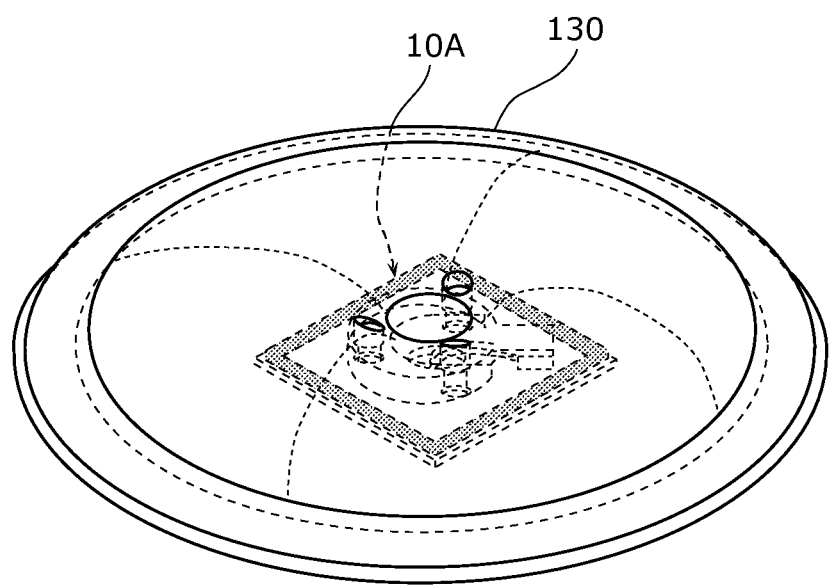
FIG. 22 illustrates a lens in an illumination device according to Embodiment 8 of the present invention.

Next, the structure of the lens 130 will be described with reference to FIG. 22. FIG. 22 illustrates the lens in the illumination device according to Embodiment 8 of the present invention.

As illustrated in FIG. 22, the lens 130 is disc shaped and has an outer surface having a predetermined curvature giving the lens 130 a predetermined lens function. In Embodiment 8, the outer surface of the lens 130 is formed so as to have, in a cross sectional view, a curvature that projects outward in an area corresponding to the sealing member 13 of the light-emitting device 10A, and in a plan view, a donut shape.

Referring back to FIG. 21B, by providing the lens 130, light emitted from the sealing member 13 of the light-emitting device 10 is focused/diverged in a predetermined direction by the lens function of the lens 130. Moreover, the lens 130 also functions as a cover for the illumination device 100 and protects the light-emitting device 10A.

Note that the lens 130 may be provided with a light diffusing function to prevent uneven luminance. For example, the lens 130 may be texture treated to give the outer surface an uneven surface, may be a light diffusing film containing a light diffusing material such as silica, or the lens 130 may be dispersed with a light diffusing material. In Embodiment 2, the entire surface of the lens 130 is treated to have a texture to allow light to leak therethrough.

Moreover, as illustrated in FIG. 21B, the lens 130 has a through-hole 131 positionally corresponding to the first through-hole 11a formed in the mounting substrate 11 of the light-emitting device 10A. With this, the fastener 40 passes though the through-hole 131 formed in the lens 130, the first through-hole 31a formed in the cover 30A, and the first through-hole 11a formed in the mounting substrate, and screws into the screw hole 122a formed in the attachment part 122 to fix the lens 130 and the light-emitting device 10A to the pedestal 20.

As illustrated in FIG. 21A and FIG. 21B, the power source device (power source circuit) 140 receives power from a utility power source (for example, AC100V) to generate power for causing the light-emitting device 10A to emit light. Moreover, the terminal base 150 connects the power source device 140 and the light-emitting device 10A and supplies power from the power source device 140 to the light-emitting device 10A. Note that the power source device 140 is attached and fixed to the attachment plate 160.

Moreover, the fixing spring (attachment spring) 170 is disposed on the outer peripheral wall of the pedestal 20. The main body 120 is attached and fixed to the ceiling by the fixing spring 170. The fixing spring 170 is, for example, a rectangular stainless steel plate with one lengthwise end bent into a V-shape, and a plurality of fixing springs 170 (for example, three) are disposed at regular intervals along the circumference of the main body 120.

The illumination device 100 according to Embodiment 8 achieves the same advantageous effects as Embodiment 2. For example, in Embodiment 8 as well, the mounting substrate 11 of the light-emitting device 10A is fastened and fixed to the pedestal 20 via the cover 30A by the fastener 40. Moreover, in Embodiment 8 as well, the LEDs 12 are mounted so as to surround the cover 30A, and the cover 30A is mounted in the region interior to the annularly arranged LEDs 12. With this, similar to Embodiment 2, degradation of light distribution characteristics can be inhibited, and warping, cracking, and splitting of the mounting substrate 11 can be inhibited.

Note that Embodiment 2 is applied to Embodiment 8, but embodiments other than Embodiment 2, such as Embodiment 1, may be applied to Embodiment 8.

Moreover, in Embodiment 8, the cover 30A may be omitted and the lens 130 may be used as the cover. In other words, the cover may also function as a lens.

Figure 21C:
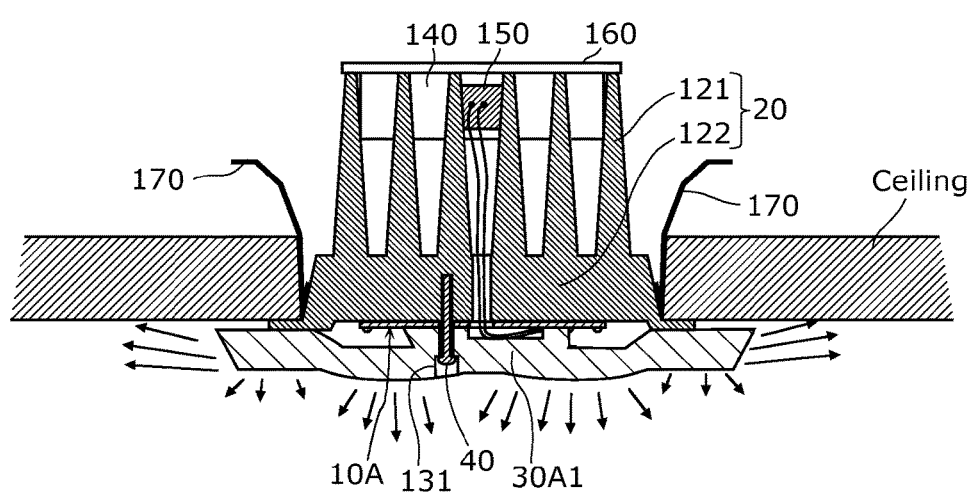
FIG. 21C is a cross sectional view of the illumination device according to a variation of Embodiment 8 of the present invention.

In this case, the lens 130 and the cover 30A illustrated in FIG. 21B may be integrally formed to form the cover 30A1 illustrated in FIG. 21C.

Embodiment 9

Next, the illumination light source according to Embodiment 9 of the present invention will be described. In Embodiment 9, the illumination light source will be exemplified as a bulb-shaped LED lamp (LED bulb).

Figure 23:
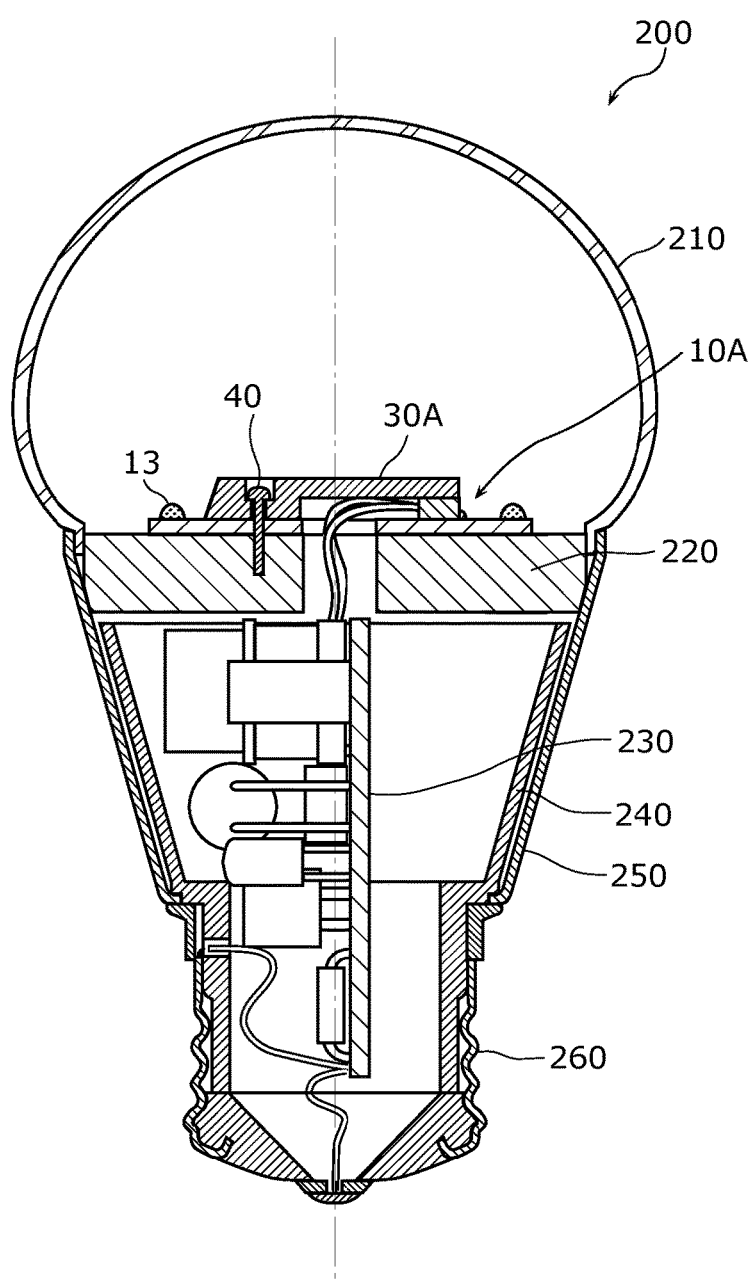
FIG. 23 is a cross sectional view of a bulb-shaped lamp according to Embodiment 9 of the present invention.

FIG. 23 is a cross sectional view of a bulb-shaped lamp according to Embodiment 9 of the present invention. Note that the illumination light source according to Embodiment 9 corresponds to the illumination light source according to Embodiment 2 and illustrated in FIG. 5 and FIG. 6, and includes the light-emitting device 10A and the cover 30A.

As illustrated in FIG. 23, the bulb-shaped lamp 200 according to Embodiment 9 is a bulb-shaped LED lamp used as a substitute for a bulb-shaped fluorescent or incandescent lamp, and includes the light-emitting device (LED module) 10A, a pedestal 220 on which the light-emitting device 10A is installed, the cover 30A, and the fastener 40. The bulb-shaped lamp 200 further includes a globe 210 covering the light-emitting device 10A, a circuit unit 230 for causing the light-emitting device 10A to emit light, a circuit holder 240 housing the circuit unit 230, a housing 250 covering the circuit holder 240, and a base 260 electrically connected to the circuit unit 230. Note that the outer chassis of the bulb-shaped lamp 200 is made up of the globe 210, the housing 250, and the base 260.

The globe 210 is a semispherical light-transmissive cover through which light emitted by the light-emitting device 10 travels out. For example, a bulb made of glass or a resin such as acrylic resin (PMMA) or polycarbonate (PC) may be used as the globe 210.

The pedestal 220 is a light source attachment member for placing and fixing the light-emitting device 10A. The light-emitting device 10A disposed on the pedestal 220 is fastened and fixed to the pedestal 220 with the fastener 40 (for example, a screw), using the cover 30A, similar to Embodiment 2. The pedestal 220 is fixed in place while the housing 250 is fitted in the opening of the housing. The pedestal 220 can be a metal pedestal formed from a metal material such as aluminum. With this, the heat generated by the light-emitting device 10A can be effectively transferred to the pedestal 220. Note that the pedestal 220 may be a resin pedestal made of resin.

Moreover, in Embodiment 9, the cover 30A covers the inner region interior to the sealing member 13 of the light-emitting device 10A. Moreover, by providing the surface of the cover 30A with a reflecting function, the light from the sealing member 13 can be reflected, making it possible to realize a bulb-shaped lamp having a wide light distribution angle.

The circuit unit 230 is a lighting circuit (power source circuit) which supplies predetermined power to the light-emitting device 10A to turn on the LEDs 12 (cause the LEDs 12 to emit light) in the light-emitting device 10A. The circuit unit 230 includes a circuit substrate and a plurality of electronic components mounted on the circuit substrate. The circuit unit 230 is fixed to the circuit holder 240.

The circuit holder 240 is an electrically insulating case for housing the circuit unit 230, and is housed in the housing 250 and the base 260. The circuit holder 240 can be formed from an electrically insulating material such as resin.

The housing 250 is disposed between the globe 210 and the base 260. The housing 250 according to Embodiment 9 is a case with both ends open, and forms the outer layer. The housing 250 can be formed from a metal material such as aluminum.

The base 260 is a receiving part which receives AC power through two electrical contacts, and is, for example, attached to a socket of a lighting fixture. In this case, when the illumination light source 1 is turned on, the base 260 receives power from the socket of the lighting fixture. Moreover, the power received by the base 260 is input into the power input unit of the circuit unit 230.

The base 260 includes a shell portion that is an approximately circular tube shape and has a threaded outer surface, and an eyelet portion attached to the shell portion via an electrically insulating part. The type of base used for the base 260 is not particularly limited, and can be screw-in Edison (E) type base, such as an E26 base, an E17 base, or an E16 base.

The bulb-shaped lamp 200 according to Embodiment 9 achieves the same advantageous effects as Embodiment 2. For example, in Embodiment 9 as well, the mounting substrate 11 of the light-emitting device 10A is fastened and fixed to the pedestal 220 by the fastener 40 via the cover 30A. Moreover, in Embodiment 9 as well, the LEDs 12 are mounted so as to surround the cover 30A, and the cover 30A is mounted in the region interior to the annularly arranged LEDs 12. With this, similar to Embodiment 2, degradation of light distribution characteristics can be inhibited, and warping, cracking, and splitting of the mounting substrate 11 can be inhibited.

Note that Embodiment 2 is applied to Embodiment 9, but embodiments other than Embodiment 2, such as Embodiment 1, may be applied to Embodiment 9.

Moreover, in Embodiment 9, the cover 30A may be omitted and a lens such as the lens according to Embodiment 7 may be used as the cover.

Moreover, by installing the bulb-shaped lamp 200 according to Embodiment 9 in a lighting fixture having a predetermined socket, the illumination device can be realized.

Embodiment 10

Next, the illumination light source according to Embodiment 10 of the present invention will be described. In Embodiment 10, the illumination light source will be exemplified as a low profile LED lamp.

Figure 24A:
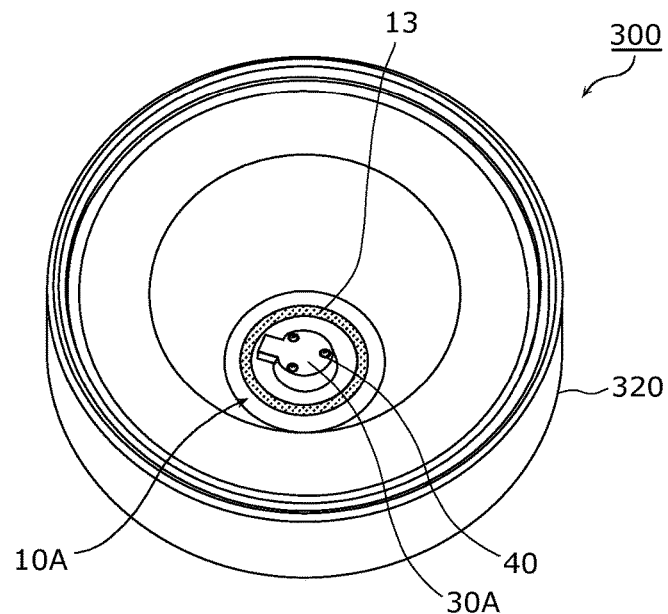
FIG. 24A is an external perspective view of an LED lamp according to Embodiment 10 of the present invention.
Figure 24B:
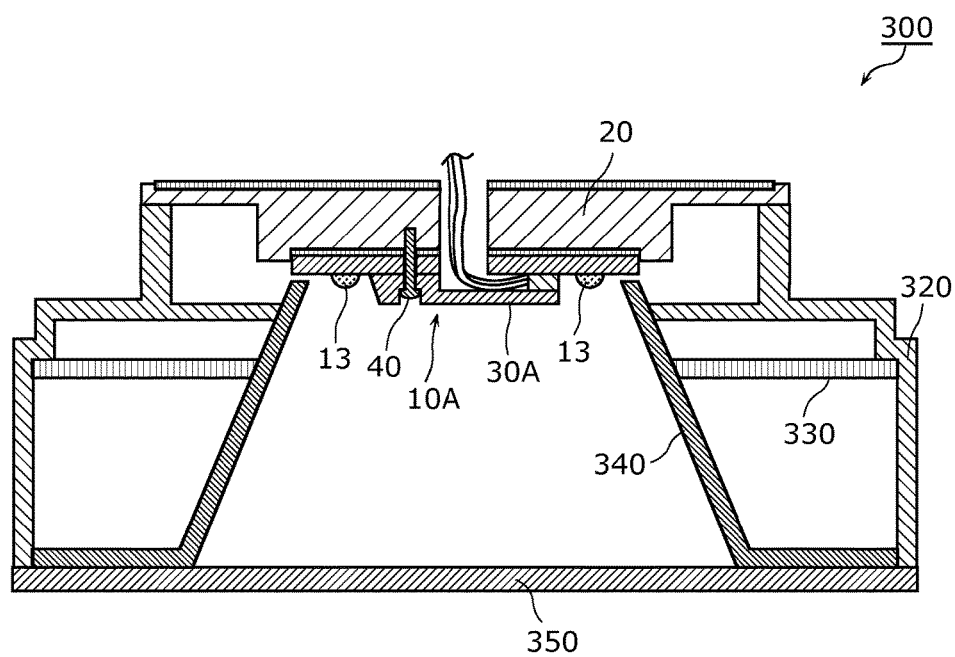
FIG. 24B is a cross sectional view of an LED lamp according to Embodiment 10 of the present invention.

FIG. 24A is an external perspective view of the LED lamp according to Embodiment 10 of the present invention. FIG. 24B is a cross sectional view of the LED lamp according to Embodiment 10 of the present invention.

As illustrated in FIG. 24A and FIG. 24B, the LED lamp 300 according to Embodiment 10 is an LED lamp having an overall discus or low-profile shape, and includes a predetermined standard base (for example, a GH76p base). Note that the illumination light source according to Embodiment 10 corresponds to the illumination light source according to Embodiment 2 and illustrated in FIG. 5 and FIG. 6, and includes the light-emitting device 10A and the cover 30A.

The LED lamp 300 includes the light-emitting device 10A, the pedestal 20 for attaching to a lighting fixture (not shown in the drawings), a housing 320 connected to the pedestal 20, a circuit substrate 330, a reflective mirror 340, and a light-transmissive cover 350. Note that in Embodiment 10, the sealing member 13 of the light-emitting device 10A is formed in a circular annular shape.

The pedestal 20 is a support base for attaching the light-emitting device 10A, and can be formed from a metal material such as aluminum. Moreover, the pedestal 20 is connected to the lighting fixture. More specifically, the top portion of the pedestal 20 is configured as, for example, a GH76p base, and is attached and fixed to the lighting fixture.

The housing 320 is a low profile, cylindrical housing that surrounds the light emitting side of the LED lamp 300. The light-emitting device 10A, the circuit substrate 330, and the reflective mirror 340 are disposed inside the housing 320. The housing 320 can be made from, for example, a resin having electrically insulating properties, such as PBT.

The circuit substrate 330 includes a circuit for causing the LEDs 12 in the light-emitting device 10A to emit light. The circuit substrate 330 is a disk-shaped substrate having a hole opened therethrough (i.e., is a donut shaped substrate), and is disposed inside the housing 320 and outside the reflective mirror 340.

The reflective mirror 340 is disposed on the light emitting side of the light-emitting device 10A, and is configured so as to reflect light emitted from the light-emitting device 10A and direct the light outward. The reflective mirror 340 can be formed from a white synthetic resin material having electrically insulating properties, such as polycarbonate. Note that the inner surface of the reflective mirror 340 may be coated with a reflective film to increase reflectivity.

The light-transmissive cover 350 is a flat component disposed over the opening of the housing 320, and functions to protect the components disposed inside the housing 320. The light-transmissive cover 350 is formed of a synthetic resin material that has a high transmittance of light, such as polycarbonate, so as to transmit the light from the light-emitting device 10A. Note that the inner surface of the light-transmissive cover 350 may be coated with a coating material to facilitate light diffusion.

The LED lamp 300 according to Embodiment 10 achieves the same advantageous effects as Embodiment 2. For example, in Embodiment 10 as well, the mounting substrate 11 of the light-emitting device 10A is fastened and fixed to the pedestal 20 via the cover 30A by the fastener 40. Moreover, in Embodiment 10 as well, the LEDs 12 are mounted so as to surround the cover 30A, and the cover 30A is mounted in the region interior to the annularly arranged LEDs 12. With this, similar to Embodiment 2, degradation of light distribution characteristics can be inhibited, and warping, cracking, and splitting of the mounting substrate 11 can be inhibited.

Moreover, in Embodiment 10, the cover 30A may be omitted and a lens such as the lens according to Embodiment 7 may be used as the cover.

Moreover, by installing the LED lamp 300 according to Embodiment 10 in a lighting fixture having a predetermined socket, the illumination device can be realized.
(Variations)

Next, variations of the above-described embodiments of the illumination light source will be described.
(Variation 1)

Figure 25:
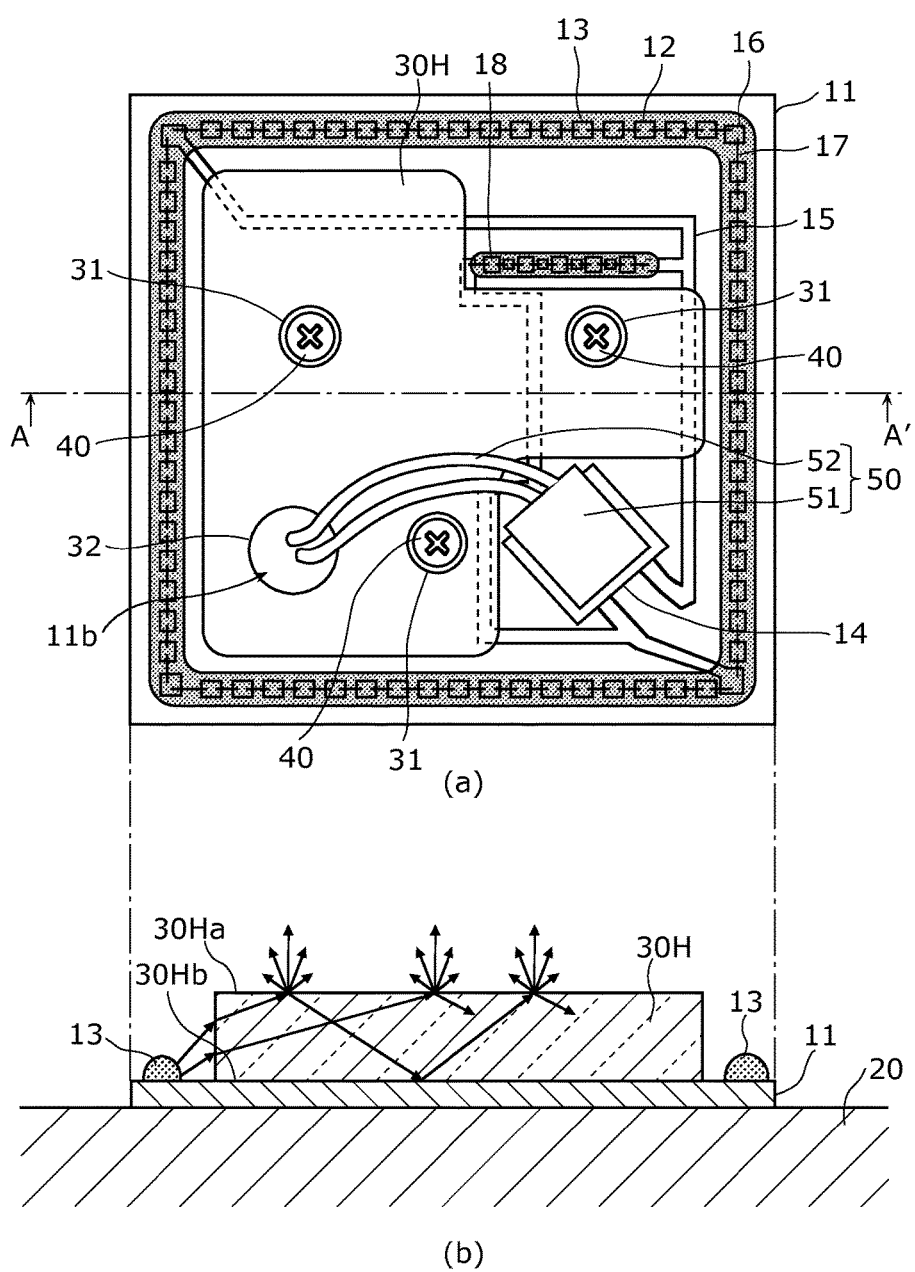
In FIG. 25, (a) is a plan view of the vicinity of a light-emitting device in an illumination light source according to Variation 1 of an embodiment of the present invention, and (b) is a cross sectional view of the vicinity of the light-emitting device in the same illumination light source, taken along line A-A' in (a).

First, Variation 1 will be described with reference to FIG. 25. In FIG. 25, (a) is a plan view of the vicinity of the light-emitting device in the illumination light source according to Variation 1 of the embodiments of the present invention, and (b) is a cross sectional view of the vicinity of the light-emitting device in the same illumination light source, taken along line A-A' in (a).

The illumination light source according to Variation 1 differs from the illumination light source according to Embodiment 2 illustrated in FIG. 2 in regard to the configuration of the cover 30H. More specifically, the cover 30H according to Variation 1 is a light-transmissive component that transmits light emitted from the sealing member 13, and is made of a transparent resin material such as acrylic resin or polycarbonate.

In Variation 1, the first surface 30Ha of the cover 30H, which is the top surface, is roughened by, for example, a texture treatment process. Moreover, the second surface 30Hb of the cover 30H, which is the bottom surface, is a smooth, flat surface (reflective surface that achieves total reflection). Note that the contactability between the mounting substrate 11 and the cover 30H is low, so a layer of air is interposed between the majority of the interface of the mounting substrate 11 and the cover 30H.

With this, as illustrated in (b) in FIG. 25, among the light emitted from the sealing member 13, the light traveling toward the inner region interior to the mounting substrate 11 enters the cover 30H from the side surface of the cover 30H. Then, a portion of the light that entered the cover 30H is diffused by the first surface 30Ha as it exits the cover 30H. Moreover, the light reflected off the first surface 30Ha is totally reflected off the second surface 30Hb and then returns to the first surface 30Ha, where one portion of the light is diffused by the first surface 30Ha as it exits the cover 30H, and another portion of the light is reflected off the first surface 30Ha.

In this way, light that is incident on the cover 30G is guided into the cover 30H, where it is diffused by the first surface 30Ha as it exits the cover 30H. With this, a surface-emitting light-emitting device (LED module) can be achieved.

Thus, when Variation 1 is applied to the illumination light source illustrated in FIG. 24A and FIG. 24B, even if the distance between the light-transmissive cover 350 (including the diffusing material) illustrated in FIG. 24B and the light-emitting device is reduced, the light-transmissive cover 350 can achieve an even luminance distribution. With this, the overall size of the illumination light source can be reduced.

Similarly, when Variation 1 is applied to the illumination light source illustrated in FIG. 23, even if the distance between the globe 210 and the light-emitting device is reduced, the globe 210 can achieve an even luminance distribution. With this, the overall size of the illumination light source can be reduced.
(Variation 2)

Figure 26:
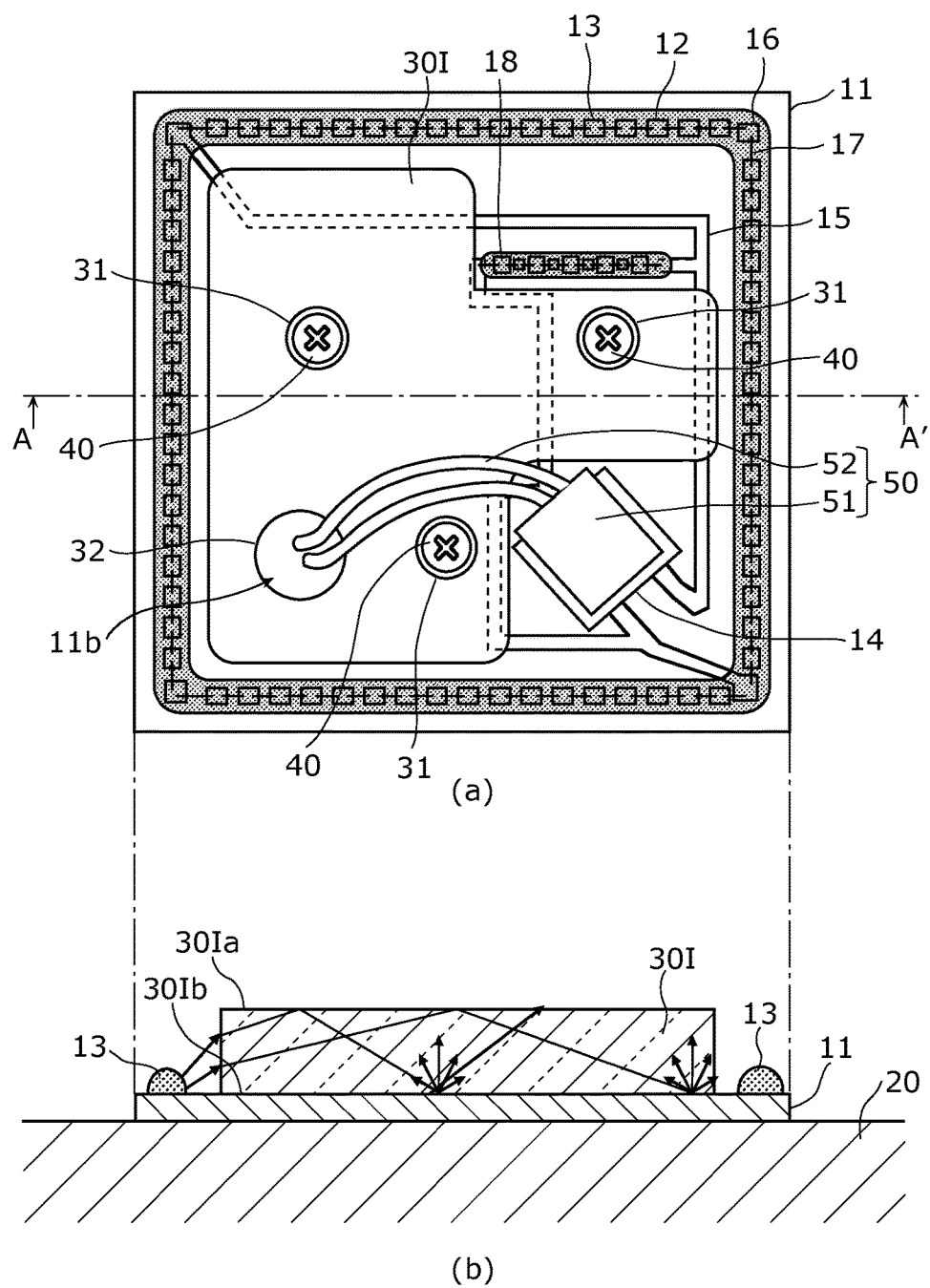
In FIG. 26, (a) is a plan view of the vicinity of a light-emitting device in an illumination light source according to Variation 2 of an embodiment of the present invention, and (b) is a cross sectional view of the vicinity of the light-emitting device in the same illumination light source, taken along line A-A' in (a).

Next, Variation 2 will be described with reference to FIG. 26. In FIG. 26, (a) is a plan view of the vicinity of the light-emitting device in the illumination light source according to Variation 2 of the embodiments of the present invention, and (b) is a cross sectional view of the vicinity of the light-emitting device in the same illumination light source, taken along line A-A' in (a).

The illumination light source according to Variation 2 differs from the illumination light source according to Variation 1 illustrated in FIG. 25 in regard to the configuration of the cover 30I. More specifically, in the cover 30I according to Variation 2, the top surface is a first surface 30Ia which is a smooth, flat surface (reflective surface that achieves total reflection), whereas the bottom surface is a second surface 30Ib which is printed with white dots. Note that similar to the cover 30H, the cover 30I is a light-transmissive component that transmits light emitted from the sealing member 13, and is made of a transparent resin material such as acrylic resin or polycarbonate.

With this, as illustrated in (b) in FIG. 26, among the light emitted from the sealing member 13, the light traveling toward the inner region interior to the mounting substrate 11 enters the cover 30I from the side surface of the cover 30I. Then, a portion of the light that entered the cover 30I is totally reflected off the first surface 30Ia, toward the second surface 30Ib. Among the light that reaches the second surface 30Ib, the component incident on the white printed dots is diffusely reflected by the second surface 30Ib toward the first surface 30Ia, and a portion of the component exits the cover 30I through the first surface 30Ia. The other light component is reflected off the first surface 30Ia and the second surface 30Ib and guided into the cover 30, and then emitted out of the cover 30I from a different section of the first surface 30Ia.

In this way, in Variation 2, light that is incident on the cover 30I is guided into the cover 30I, where it is diffused by the second surface 30Ib before exiting the cover 30I through the first surface 30Ia. With this, a surface-emitting light-emitting device (LED module) can be achieved.

Thus, similar to Variation 1, when Variation 2 is applied to the illumination light source illustrated in FIG. 24A and FIG. 24B, even if the distance between the light-transmissive cover 350 (including the diffusing material) illustrated in FIG. 24B and the light-emitting device is reduced, the light-transmissive cover 350 can achieve an even luminance distribution. Similarly, when Variation 2 is applied to the illumination light source illustrated in FIG. 23, even luminance distribution can be achieved. With this, the overall size of the illumination light source can be reduced.

Figure 27A:
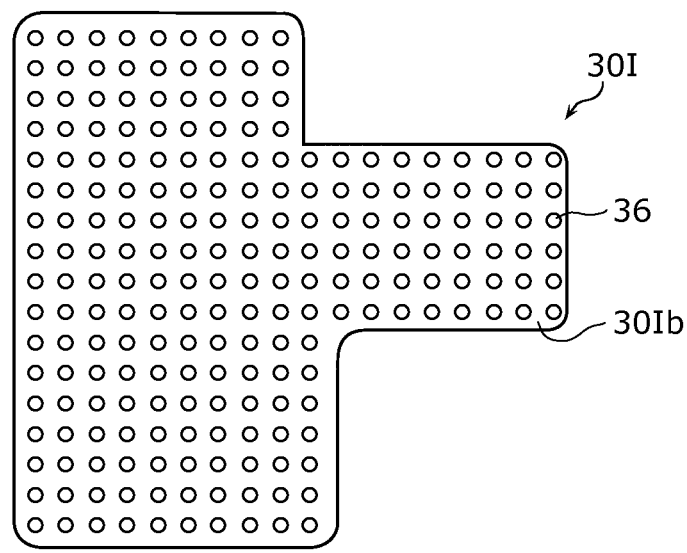
FIG. 27A illustrates a cover in an illumination light source according to Variation 2 of an embodiment of the present invention.

Moreover, in Variation 2, the cover 30I can be configured as illustrated in FIG. 27A. FIG. 27A illustrates the cover in the illumination light source according to Variation 2 of the embodiments of the present invention.

As illustrated in FIG. 27A, by evenly applying white dots on the second surface 30Ib (bottom surface) of the cover 30I, the second surface 30Ib can be made to be a white dot printed surface.

Figure 27B:
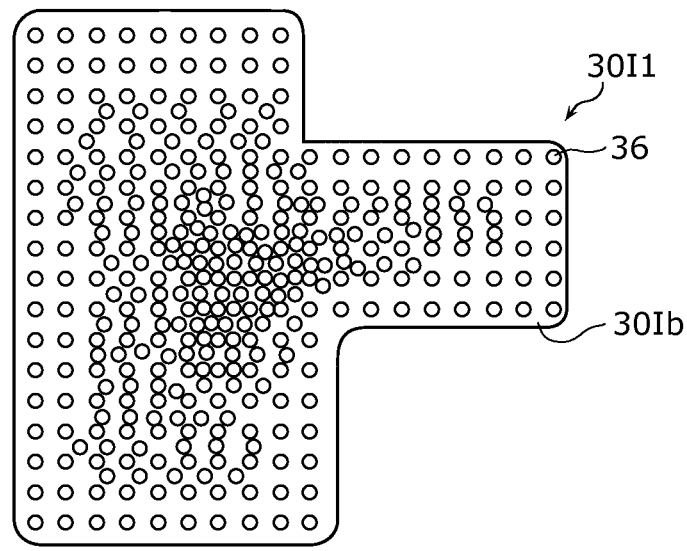
FIG. 27B illustrates another cover in an illumination light source according to Variation 2 of an embodiment of the present invention.

Moreover, the distribution of the white dots 36 is not limited to an even distribution; the white dots 30 may be more densely distributed in certain areas. For example, as illustrated in FIG. 27B, the density of the white dots 36 may increase from the edges of the cover 30I toward the center. In other words, the white dots 36 may increase in density from the peripheral region toward the central region of the cover 30I. With this, the emission of light through the first surface 30Ia (top surface) of the cover 30I can be made to be even more uniform.

Note that the density distributions illustrated in FIG. 27A and FIG. 27B can also be applied to the roughness of the first surface 30Ha according to Variation 1 illustrated in FIG. 25 and the first surface 30Ja according to Variation 3 (descried below). For example, in the cover 30H illustrated in FIG. 25, the density of the roughness may be increased with proximity to the center, so as to achieve an even luminance distribution even though guided light components decrease with proximity to the center.

(Variation 3)

Figure 28:
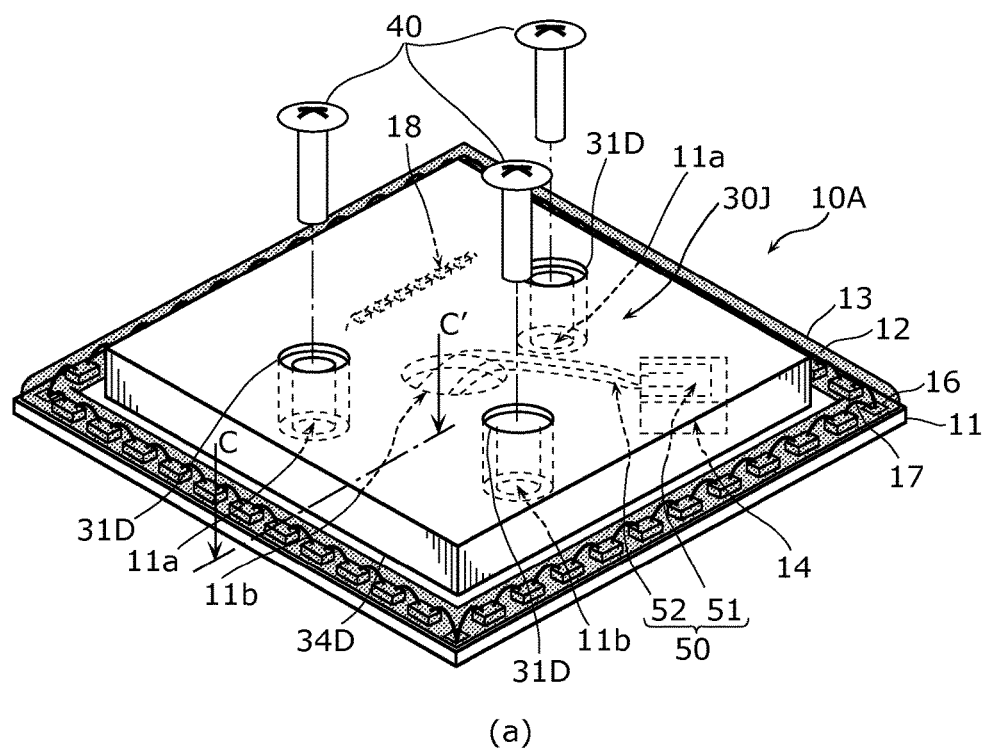
In FIG. 28, (a) is a perspective view of the vicinity of a light-emitting device in an illumination light source according to Variation 3 of an embodiment of the present invention, and (b) is a cross sectional view of the vicinity of the light-emitting device in the same illumination light source, taken along line C-C' in (a).
Figure 28:
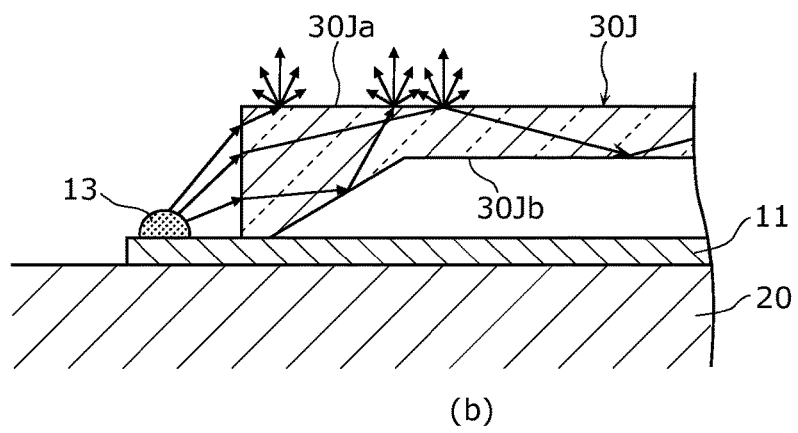

Next, Variation 3 will be described with reference to FIG. 28. In FIG. 28, (a) is a perspective view of the vicinity of the light-emitting device in the illumination light source according to Variation 3 of the embodiments of the present invention, and (b) is a cross sectional view of the vicinity of the light-emitting device in the same illumination light source, taken along line C-C' in (a).

The illumination light source according to Variation 3 differs from the illumination light source illustrated in FIG. 12 in regard to the configuration of the cover 303. More specifically, the cover 303 according to Variation 3 is a light-transmissive component that transmits light emitted from the sealing member 13, and is made of a transparent resin material such as acrylic resin or polycarbonate, similar to Variations 1 and 2.

In Variation 3, the first surface 30Ja of the cover 303, which is the top surface, is roughened by, for example, a texture treatment process. Moreover, the second surface 30Jb of the cover 303, which is the bottom surface, is a tapered surface (reflective surface that achieves total reflection) in the peripheral section of the cover 303, and a smooth, flat surface (reflective surface that achieves total reflection) in all other sections. Moreover, the outer side surface of the cover 303 is perpendicular to the main surface of the mounting substrate 11.

With this, as illustrated in (b) in FIG. 28, among the light emitted from the sealing member 13, the light traveling toward the inner region interior to the mounting substrate 11 enters the cover 303 from the side surface of the cover 303. Then, a portion of the light that entered the cover 303 is diffused by the first surface 30Ja as it exits the cover 303. Moreover, the light reflected off the first surface 30Ja is totally reflected off the second surface 30Jb and then returns to the first surface 30Ja, where the light is diffused by the first surface 30Ja as it exits the cover 303.

In this way, in Variation 3, light that is incident on the cover 303 is guided into the cover 303, where it is diffused by the first surface 30Ja as it exits the cover 303. With this, a surface-emitting light-emitting device (LED module) can be achieved.

Thus, similar to Variation 1, when Variation 3 is applied to the illumination light source illustrated in FIG. 24A and FIG. 24B, even if the distance between the light-transmissive cover 350 (including the diffusing material) illustrated in FIG. 24B and the light-emitting device is reduced, the light-transmissive cover 350 can achieve an even luminance distribution. Similarly, when Variation 3 is applied to the illumination light source illustrated in FIG. 23, even luminance distribution can be achieved. With this, the overall size of the illumination light source can be reduced.

(Other Variations)

The illumination light source and the illumination device according to the present invention have been described based on embodiments and variations thereof, but the present invention is not limited to these embodiments and variations.

For example, in the above embodiments, the sealing member 13 in the light-emitting device 10 and the light-emitting device 10A is formed continuously, without interruption, but the sealing member 13 is not limited to this example.

Figure 29A:
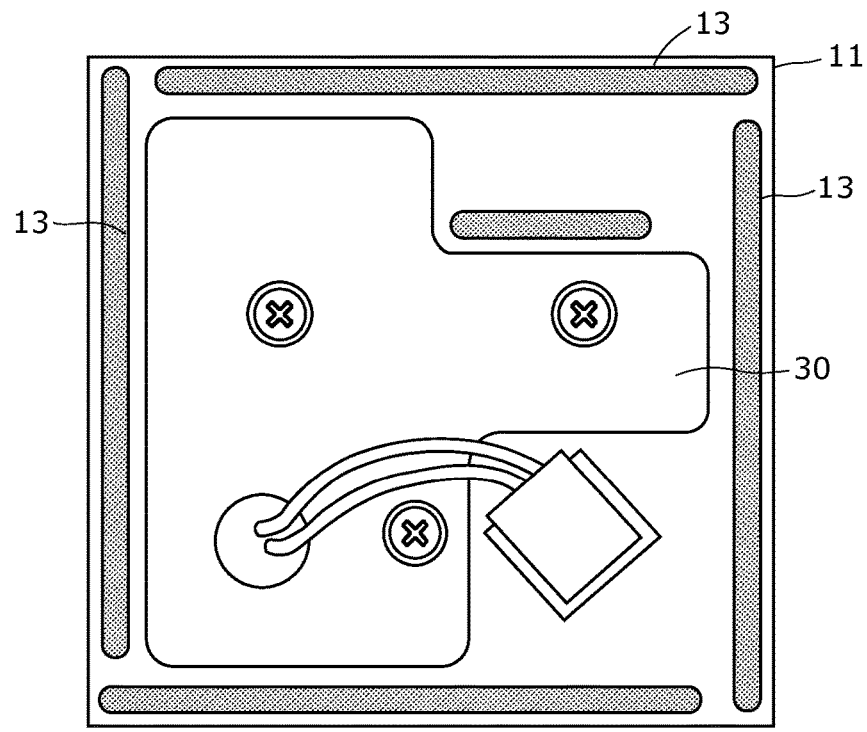
FIG. 29A is a plan view of Variation 1 of a light-emitting device according to the present invention.
Figure 29B:
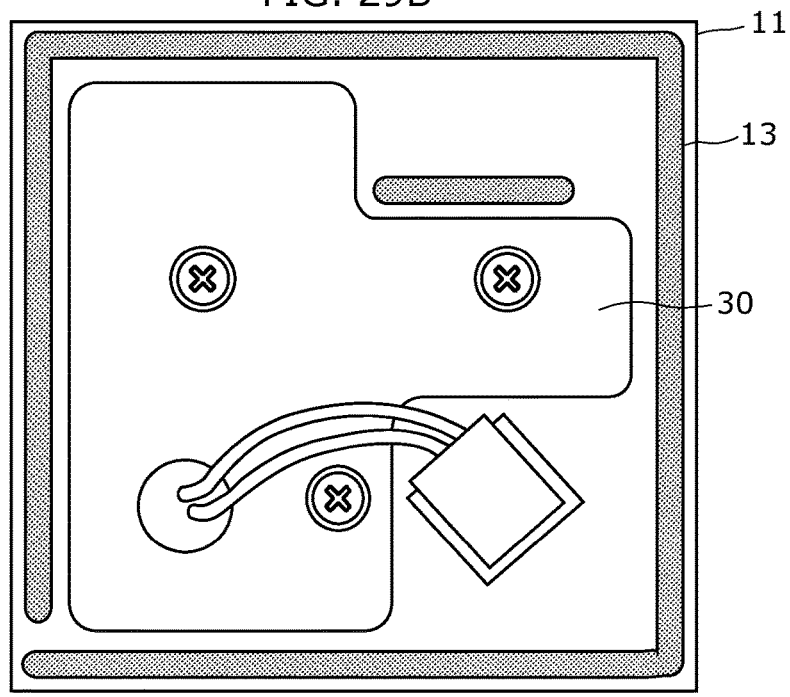
FIG. 29B is a plan view of Variation 2 of a light-emitting device according to the present invention.

More specifically, as the light-emitting device in FIG. 29A illustrates, the sealing member 13 may be formed in straight lines along each edge of the mounting substrate 11 to collectively form an annular sealing line. In other words, the sealing member 13 may be discontinuously formed in straight lines along each edge of the mounting substrate 11 to form an annular sealing line. Alternatively, as the light-emitting device illustrates in FIG. 29B, the sealing member 13 may be formed along the entire perimeter of the mounting substrate 11 with an interruption in one portion so as to form an annular sealing line. Thus, the "annular sealing member" includes configurations which, by extending the sealing member along the shape of the sealing member at the interrupted portion, are annular, even if a portion of the sealing member is interrupted.

Figure 30:
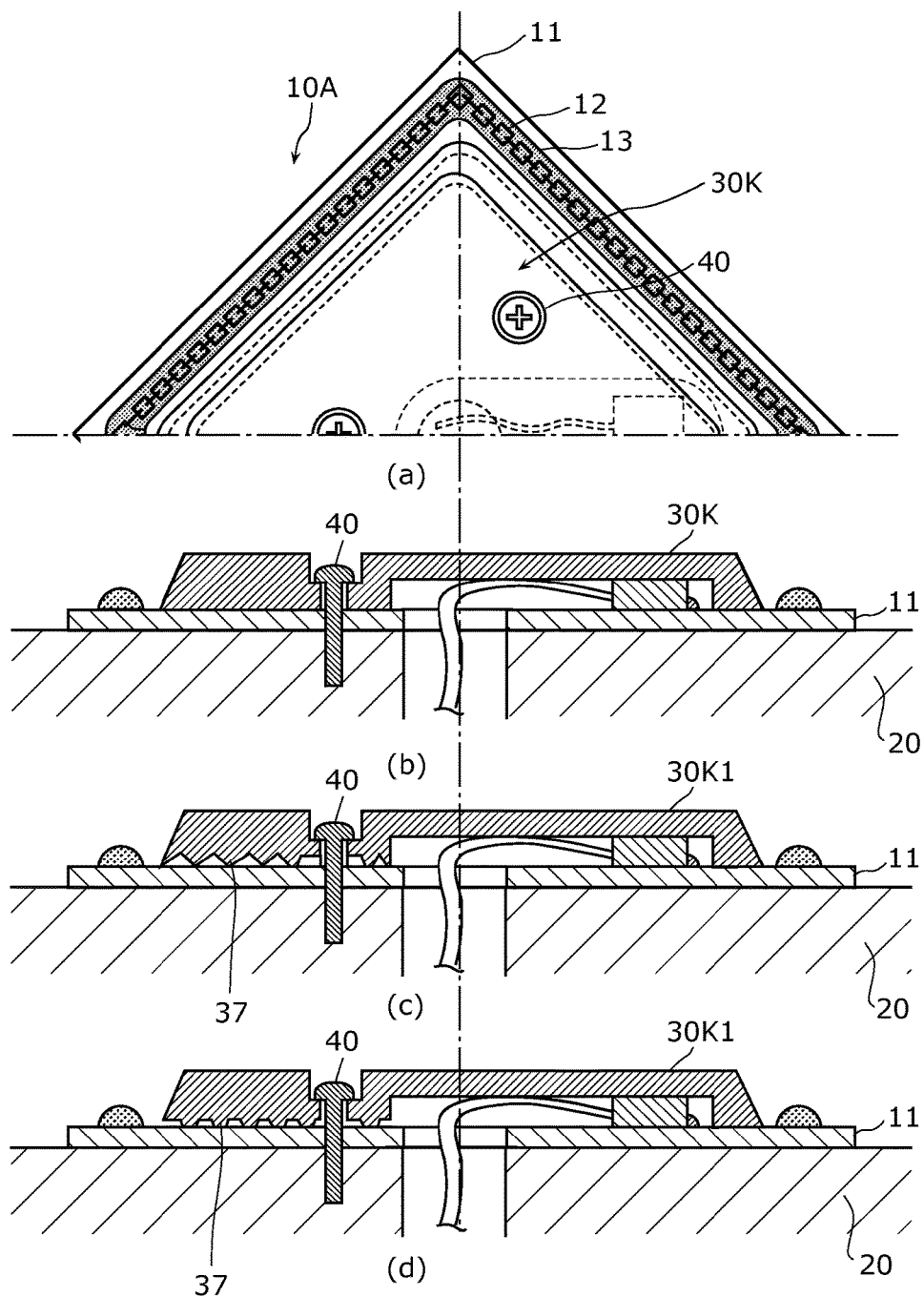
In FIG. 30, (a) is a partial plan view of a variation of a cover in an illumination light source according to the present invention, and (b) through (d) are cross sectional views of variations of a cover in an illumination light source according to the present invention.

Moreover, the cover illustrated in FIG. 30 may also be used. For example, the cover 30K illustrated in (a) in FIG. 30, is equivalent to the cover 30A according to Embodiment 2 illustrated in FIG. 5 and FIG. 6 that has been shaped to have a square shape in a plan view. In this way, the external shape of the cover may be changed as desired.

Moreover, as illustrated in (c) and (d) in FIG. 30, the surface of the cover 30K1 that is in contact with the mounting substrate 11 may include raised portions 37. By including these raised portions 37, when the cover 30K1 is fastened down by the fastener 40, the raised portions 37 are pressed against the surface of the mounting substrate 11, causing the raised portions 37 to change shape when they are in contact with the mounting substrate 11, and thus, compared to (a) in FIG. 30 where the raised portions 37 are not provided, the surface area of contact between the cover 30K1 and the mounting substrate 11 can be increased. Note that the raised portions 37 may be applied to the embodiments described above, and in particular, applying the raised portions 37 to Embodiment 3 in which part of the frame section of the cover spreads outward when the cover is fastened is preferable.

Moreover, in the above embodiments and variations, the sealing member 13 (sealing line) and the LEDs 12 (element line) are arranged so as to be parallel to an edge of the mounting substrate 11, but the arrangement is not limited to this example. For example, irrespective of the plan view shape of the mounting substrate 11, the LEDs 12 may be arranged in an annular shape and the sealing member 13 may be formed in an annular shape. More specifically, the LEDs 12 may be arranged and the sealing member 13 may be formed in a circular annular shape on a substrate having a polygonal shape in a plan view, such as a square substrate. Conversely, the LEDs 12 may be arranged and the sealing member 13 may be formed in a polygonal shape such as a rectangle on a substrate having a circular shape in a plan view.

Moreover, in the above embodiments and variations, the sealing member 13 (sealing line) and the LEDs 12 (element line) are formed in one annular shape, but the sealing member 13 (sealing line) and the LEDs 12 (element line) may be formed in two or more annular shapes.

Moreover, in the above embodiments and variations, as the light-emitting element on the mounting substrate 11, the light-emitting device (light-emitting module) is exemplified as a COB device with directly mounted LED chips. An LED element package (SMD LED element) including a resin container having a cavity, an LED chip mounted in the cavity, and a sealing member (phosphor-containing resin) filling the cavity, may be disposed in plural on the mounting substrate 11 on which metal lines are formed to form an SMD light-emitting device (LED module).

Moreover, in the above embodiments and variations, the light-emitting device is configured to emit white light using a blue LED chip and a yellow phosphor, but the present invention is not limited to this example. For example, in order to increase color rendering properties, in addition to the yellow phosphor, a red phosphor or a green phosphor may be mixed in. Moreover, a configuration is possible in which, without using a yellow phosphor, a phosphor-containing resin which includes red and green phosphors is used and white light is radiated when used in combination with a blue LED chip.

Moreover, in the above embodiment and variations, the LED chip may be configured using an LED chip which emits light of a color other than blue. For example, when an LED chip which emits ultra-violet rays is used, a combination of phosphor particles which respectively emit the three primary colors (red, green and blue) may be used. Furthermore, wavelength converting materials other than phosphor particles may be used. For example, materials including a substance which absorbs a certain wavelength of light and emits light of a different wavelength, such as semiconductors, metal complexes, organic dyes, and pigments, may be used.

Moreover, although the light-emitting element is exemplified as an LED in the above embodiments and variations, a semiconductor light-emitting element such as a semiconductor laser, or a solid light-emitting element such as an organic or inorganic electroluminescence (EL) element may be used as the light-emitting element.

Moreover, in Embodiments 1 through 7, the light-emitting device, the pedestal, the cover, and the fastener are exemplified as being installed in the illumination light source, but this example is not limiting. For example, in Embodiments 1 through 7, the light-emitting device, the pedestal, the cover, and the fastener may be installed in the illumination device and, alternatively, may be installed in another light-emitting device.

Although only exemplary embodiments of the present invention and variations thereof have been described in detail above, those skilled in the art will readily appreciate that many modifications are possible in the exemplary embodiments and variations without materially departing from the novel teachings and advantages of the present invention. Accordingly, all such modifications are intended to be included within the scope of the present invention.

INDUSTRIAL APPLICABILITY

The present invention is applicable to illumination light sources and illumination devices having light-emitting elements, and in particular, to, for example, an illumination light source and illumination device such as a lamp that includes a light-emitting device, and is also widely applicable to other light-emitting devices.

REFERENCE SIGNS LIST 10, 10A light-emitting device
11 mounting substrate
11a, 31, 31A, 31B, 31C, 31D, 31E, 31F, 31G first through-hole
11b, 32 second through-hole
12 LED
13 sealing member
14 power supply part
15 line
16 pad
17 wire
18 protective element
20, 220 pedestal
20a fixing hole
30, 30A, 30A1, 30B, 30C, 30D, 30E, 30F, 30G, 30H, 30I, 30I1, 30J, 30K, 30K1 cover
30Ha, 30Ia, 30Ja first surface
30Hb, 30Ib, 30Jb second surface
31a housing part
31B1, 31C1, 31E1, 31G1 cover guide
33, 33E, 33E1, 33E2 holding part
33A2 cover part
34, 34G outer side surface 34a, 34Ga incision
35 projection
36 white dot
37 raised portion
40 fastener
50 lead
51 connector part
52 electrically conductive wire
100 illumination device
120 main body
121 heat dissipating fins
122 attachment part
122a screw hole
130 lens
131 through-hole
140 power source device
150 terminal base
160 attachment plate
170 fixing spring
200 bulb-shaped lamp
210 globe
230 circuit unit
240 circuit holder
250 housing
260 base
300 LED lamp
320 housing
330 circuit substrate
340 reflective mirror
350 light-transmissive cover

The invention claimed is:

1. An illumination light source comprising:
a pedestal;
a mounting substrate disposed on the pedestal;
a plurality of light-emitting elements on a main surface of the mounting substrate, the main surface extending in a horizontal direction;
a cover, having a planar upper surface and defined by an outer periphery, which covers a partial region of the main surface of the mounting substrate, the entirety of the cover being spaced in the horizontal direction from the plurality of light-emitting elements so that none of the plurality of light-emitting elements are even partially covered by the cover in a vertical direction, the vertical direction extending transverse to the horizontal direction; and
a fastener which fastens the pedestal and the cover together while the mounting substrate is interposed between the pedestal and the cover,
wherein the plurality of light-emitting elements are provided around the cover and beyond the outer periphery of the cover such that the cover does not surround, in a plane of the cover, any light emitting elements provided on the main surface of the mounting substrate.

2. The illumination light source according to claim 1,
wherein the plurality of light-emitting elements are arranged in an annular shape in a peripheral portion of the mounting substrate, and
the cover is disposed in a region interior to the plurality of light-emitting elements arranged in the annular shape.

3. The illumination light source according to claim 1,
wherein the cover has a through-hole for passing through the fastener, and
part of the cover is located on an outer side of the through-hole.

4. The illumination light source according to claim 3,
wherein the mounting substrate has a through-hole having a diameter that is greater than a diameter of the through-hole in the cover.

5. The illumination light source according to claim 3,
wherein the mounting substrate has a through-hole having an opening shaped such that a length of the opening in a first direction is greater than a length of the opening in a second direction perpendicular to the first direction, the first direction being along a straight line passing through a center of the mounting substrate and a center of the through-hole in the mounting substrate.

6. The illumination light source according to claim 1,
wherein the cover has a closed-bottom tubular shape, and includes a frame section which has a tubular shape, defines an opening, and is in surface contact with the main surface of the mounting substrate.

7. The illumination light source according to claim 6,
wherein the frame section has a sloping side surface, and the opening defined by the frame section has an area that decreases with distance from the mounting substrate.

8. The illumination light source according to claim 6, further comprising
an electrically conductive component disposed on the main surface of the mounting substrate,
wherein the electrically conductive component is housed under the cover.

9. The illumination light source according to claim 8,
wherein the electrically conductive component is at least one of a power supply part which receives external power for causing the plurality of light-emitting elements to emit light, a line which electrically connects the power supply part and the plurality of light-emitting elements, and a protective element which electrostatically protects the plurality of light-emitting elements.

10. The illumination light source according to claim 6, further comprising
a power supply part which is disposed on the main surface of the mounting substrate and receives external power for causing the plurality of light-emitting elements to emit light,
wherein the cover includes a holding part which holds down a connector of a lead connected to the power supply part.

11. The illumination light source according to claim 6,
wherein the cover is configured such that part of the frame section spreads outward when the cover is fastened by the fastener.

12. The illumination light source according to claim 1,
wherein the cover is plate-shaped and in surface contact with the main surface of the mounting substrate.

13. The illumination light source according to claim 1,
wherein the cover also functions as a lens.

14. The illumination light source according to claim 1,
wherein the cover includes a recessed portion that houses an end portion of the fastener.

15. The illumination light source according to claim 1,
wherein the fastener is a screw.

16. The illumination light source according to claim 1,
wherein the plurality of light-emitting elements is a plurality of light-emitting diode chips located directly on the mounting substrate, and
a sealing member on the mounting substrate collectively seals the plurality of light-emitting diode chips.

17. The illumination light source according to claim 1,
wherein the plurality of light-emitting elements each include an LED element package.

18. The illumination light source according to claim 16, wherein the sealing member includes a wavelength converting material which converts a wavelength of light emitted by the plurality of light-emitting diode chips.

19. An illumination device comprising:
the illumination light source according to claim 1.

20. An illumination light source comprising:
a pedestal;
a mounting substrate disposed on the pedestal;
a plurality of light-emitting elements on a main surface of the mounting substrate, the main surface extending in a horizontal direction;
a cover, having a planar upper surface, which covers a partial region of the main surface of the mounting substrate, the entirety of the cover being spaced in the horizontal direction from the plurality of light-emitting elements so that none of the plurality of light-emitting elements are even partially covered by the cover in a vertical direction, the cover being free from light admitting apertures, the vertical direction extending transverse to the horizontal direction; and
a fastener which fastens the pedestal and the cover together while the mounting substrate is interposed between the pedestal and the cover,
wherein the plurality of light-emitting elements surround the cover and no portion of the cover being interposed, in a plane of the cover, between adjacent light emitting elements.

\* \* \* \* \*